(12) United States Patent
Vora

(10) Patent No.: US 7,727,821 B2
(45) Date of Patent: Jun. 1, 2010

(54) IMAGE SENSING CELL, DEVICE, METHOD OF OPERATION, AND METHOD OF MANUFACTURE

(75) Inventor: Madhu B. Vora, Los Gatos, CA (US)

(73) Assignee: SuVolta, Inc., Los Gatos, CA (US)

( * ) Notice: Subject to any disclaimer, the term of this patent is extended or adjusted under 35 U.S.C. 154(b) by 417 days.

(21) Appl. No.: 11/799,571

(22) Filed: May 1, 2007

(65) Prior Publication Data

US 2008/0272414 A1    Nov. 6, 2008

(51) Int. Cl.
*H01L 21/339* (2006.01)
*H01L 29/768* (2006.01)

(52) U.S. Cl. .................... 438/147; 257/240
(58) Field of Classification Search ............ 438/75–77, 438/114–148; 257/220, 240, E27.15–E27.163, 257/E29.227–E29.24
See application file for complete search history.

(56) References Cited

U.S. PATENT DOCUMENTS

| | | | |
|---|---|---|---|
| 3,412,286 A | 11/1968 | Grebene | |
| 3,930,300 A | 1/1976 | Nicolay | |
| 3,951,702 A | 4/1976 | Kano et al. | |
| 3,964,083 A * | 6/1976 | Lohstroh | 257/258 |
| 3,967,305 A | 6/1976 | Zuleeg | |
| 4,036,672 A | 7/1977 | Kobayashi | |
| 4,040,082 A | 8/1977 | Goser | |
| 4,064,525 A | 12/1977 | Kano et al. | |
| 4,126,900 A | 11/1978 | Koomen et al. | |
| 4,228,367 A | 10/1980 | Brown | |
| 4,333,224 A | 6/1982 | Buchanan | |
| 4,485,392 A | 11/1984 | Singer | |
| 4,613,772 A | 9/1986 | Young | |
| 4,638,344 A * | 1/1987 | Cardwell, Jr. | 327/566 |

(Continued)

FOREIGN PATENT DOCUMENTS

DE    10 2004 004283 A1    8/2005

(Continued)

OTHER PUBLICATIONS

U.S. Appl. No. 11/799,572, Vora.

(Continued)

*Primary Examiner*—Calvin Lee
(74) *Attorney, Agent, or Firm*—Haverstock & Owens, LLP

(57) ABSTRACT

An image sensing device can include one or more image sensing cells. Each image sensing cell can have a charge store element formed from a semiconductor material doped to a first conductivity type. The charge store element can be in contact with a channel region formed from a semiconductor material doped to a second conductivity type. The charge store element can have one or more surfaces for exposure to an image source. Each image sensing cell can also include a charge electrode formed from a semiconductor material doped to the first conductivity type that is separated from the charge store element by a semiconductor material doped to the second conductivity type. In addition, one or more current detection electrodes can be included in each image sensing cell. A current detection electrode can pass a current flowing through the channel region in a read operation. Such an image sensing cell can be compact in size and/or have a large image sensing area.

13 Claims, 12 Drawing Sheets

CHARGE (Punchthrough)

ACQUIRE

U.S. PATENT DOCUMENTS

| | | |
|---|---|---|
| 4,668,971 A | 5/1987 | Hynecek |
| 4,698,653 A | 10/1987 | Cardwell, Jr. |
| 4,751,556 A | 6/1988 | Cogan et al. |
| 4,853,561 A | 8/1989 | Gravrok |
| 5,130,770 A | 7/1992 | Blanc et al. |
| 5,243,209 A | 9/1993 | Ishii |
| 5,298,778 A * | 3/1994 | Yonemoto .................. 257/257 |
| 5,618,688 A | 4/1997 | Reuss et al. |
| 5,764,096 A | 6/1998 | Lipp et al. |
| 5,773,891 A | 6/1998 | Delgado et al. |
| 5,841,159 A | 11/1998 | Lee et al. |
| 5,973,341 A | 10/1999 | Letavic et al. |
| 6,040,592 A | 3/2000 | McDaniel et al. |
| 6,111,245 A | 8/2000 | Wu et al. |
| 6,130,423 A | 10/2000 | Brehmer et al. |
| 6,141,050 A | 10/2000 | Ackland et al. |
| 6,221,687 B1 | 4/2001 | Abramovich |
| 6,307,223 B1 | 10/2001 | Yu |
| 6,417,022 B1 | 7/2002 | Hsiao et al. |
| 2002/0197779 A1 | 12/2002 | Evans |
| 2004/0217395 A1 | 11/2004 | Takamura |

FOREIGN PATENT DOCUMENTS

| | | |
|---|---|---|
| EP | 0193842 | 9/1986 |
| GB | 2208967 A | 4/1989 |
| JP | 60-258948 | 12/1935 |
| JP | 60258948 A | 12/1985 |

OTHER PUBLICATIONS

Takagi et al., "Complementary JFET Negative-Resistance Devices", *IEEE Journal of Solid-State Circuits*, Dec. 1975, pp. 509-515, vol. SC-10, No. 6.

Heald et al., "Multilevel Random-Access Memory Using One Transistor Per Cell", *IEEE Journal of Solid-State Circuits*, Aug. 1976, pp. 519-528, vol. SC-11, No. 4.

Annex to Form PCT/ISA/206 Communication Relating to the Results of the Partial International Search for International Application PCT/US2008/061941, dated Oct. 22, 2008.

International Search Report and Written Opinion of the International Search Authority for International Application PCT/US2008/061941, dated Dec. 10, 2008.

* cited by examiner

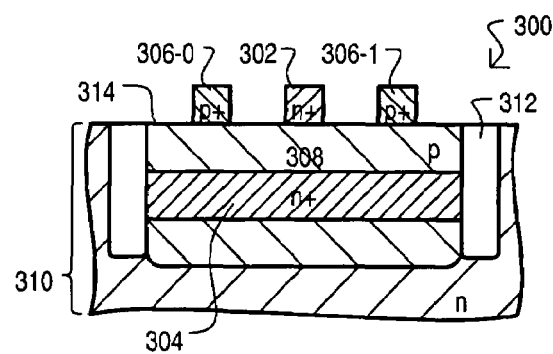
FIG. 3
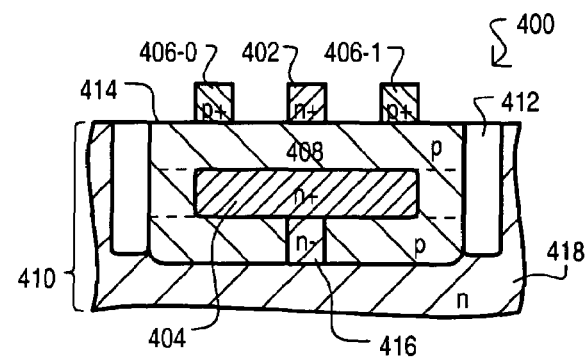
FIG. 4
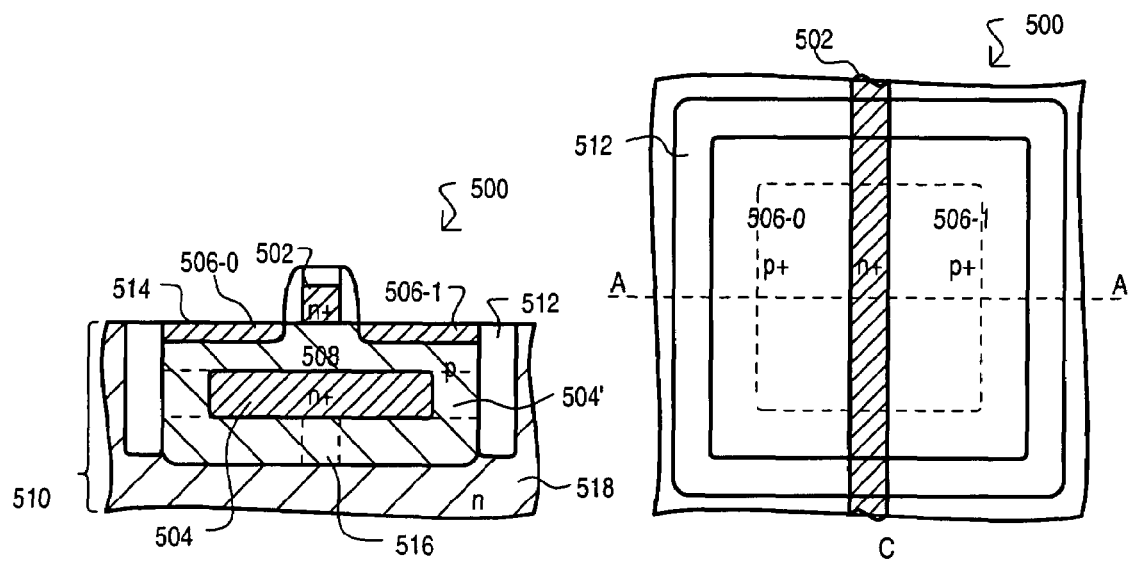
FIG. 5A
FIG. 5B

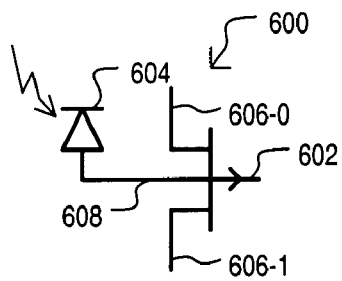
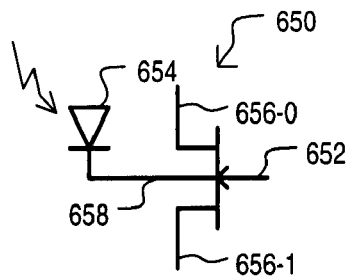
FIG. 6A	FIG. 6B
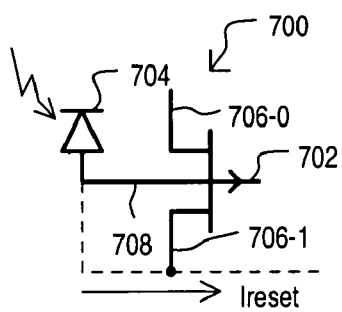
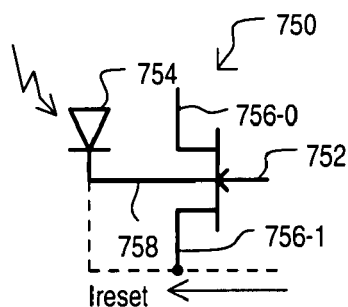
FIG. 7A	FIG. 7B
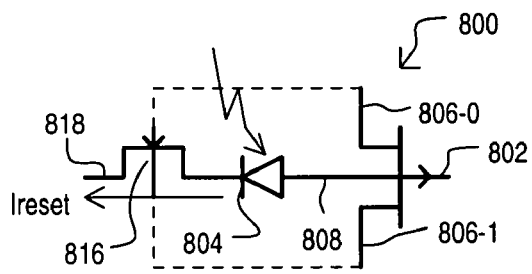
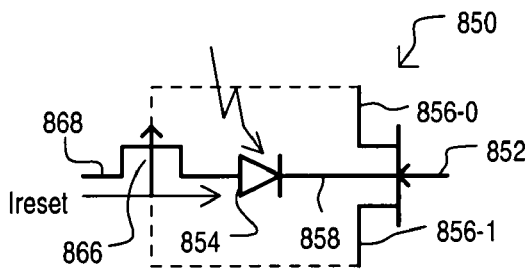
FIG. 8A	FIG. 8B
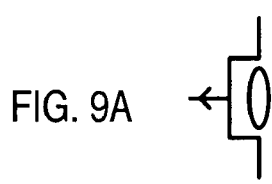
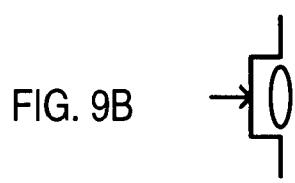
FIG. 9A	FIG. 9B

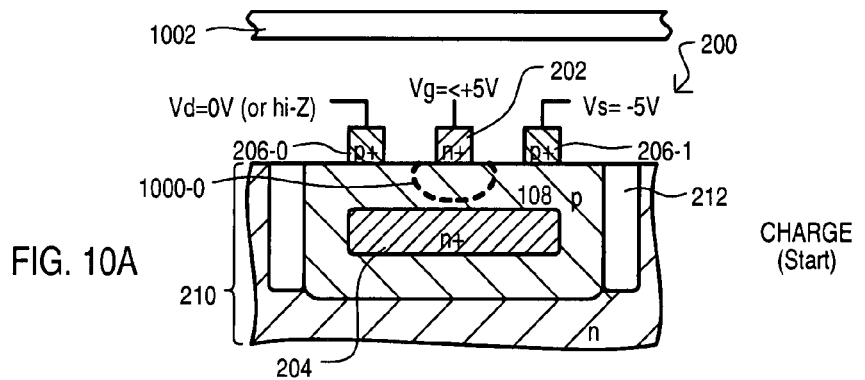
FIG. 10A  CHARGE (Start)
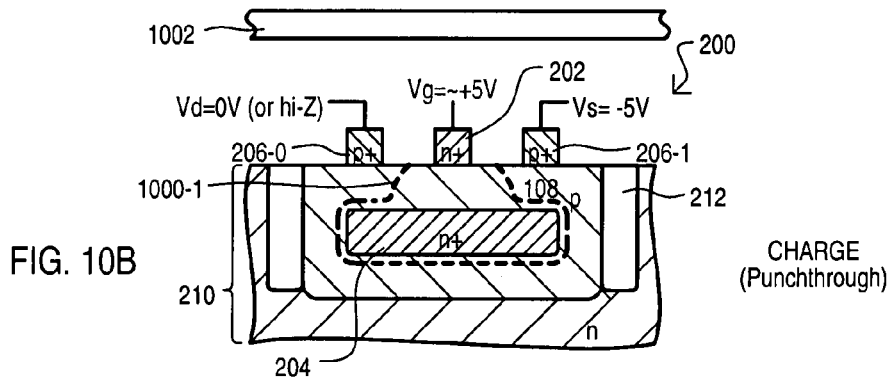
FIG. 10B  CHARGE (Punchthrough)
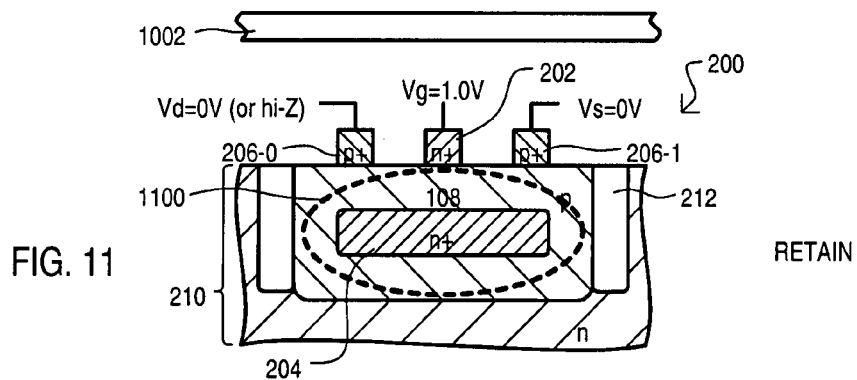
FIG. 11  RETAIN
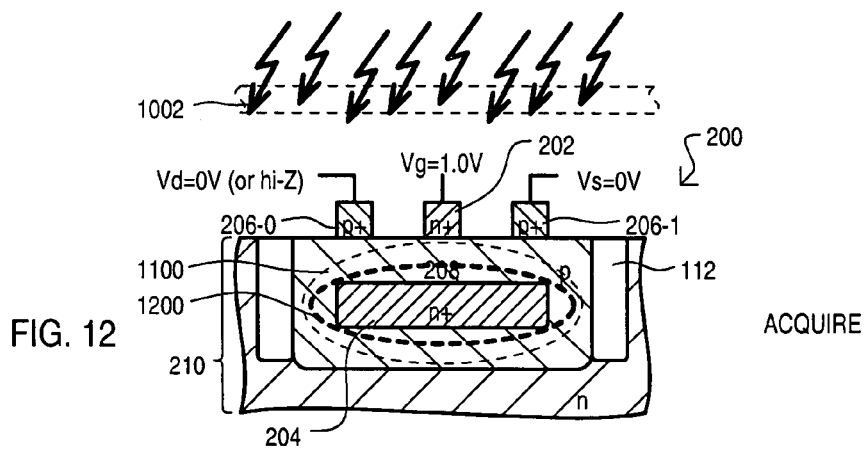
FIG. 12  ACQUIRE

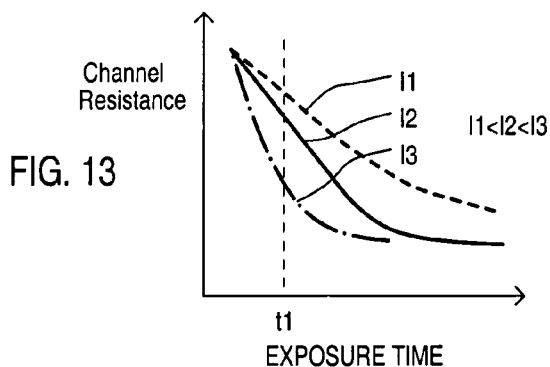
FIG. 13
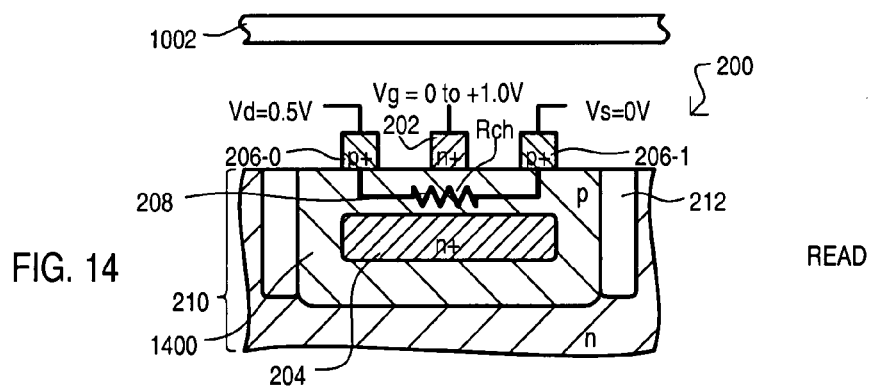
FIG. 14     READ
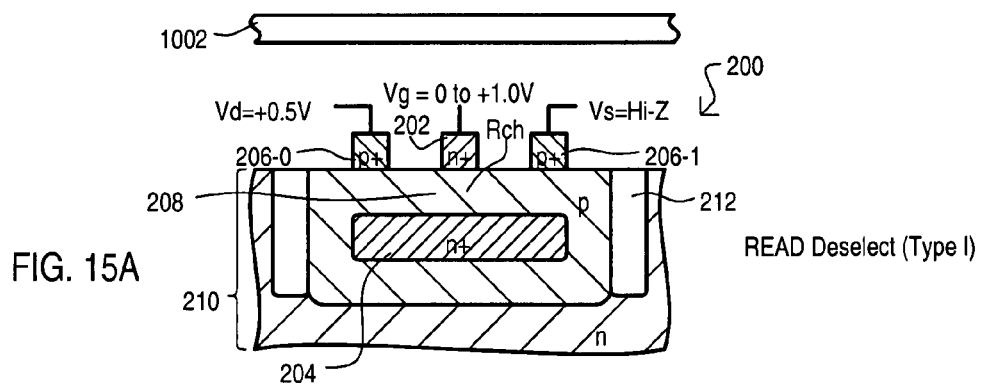
FIG. 15A     READ Deselect (Type I)
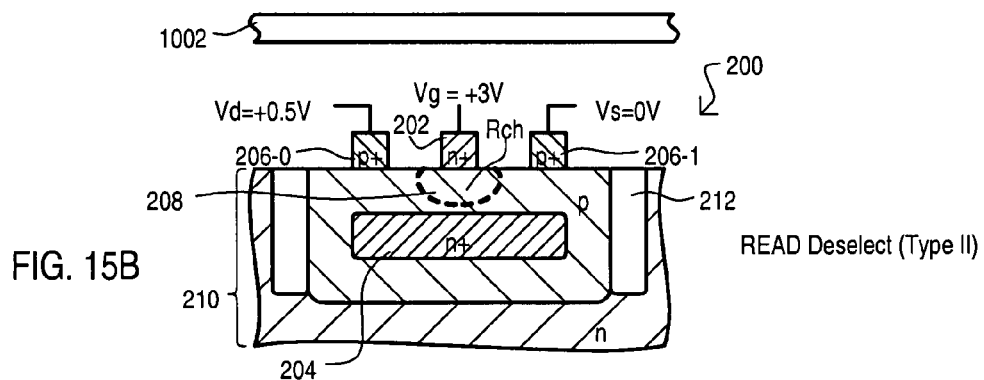
FIG. 15B     READ Deselect (Type II)

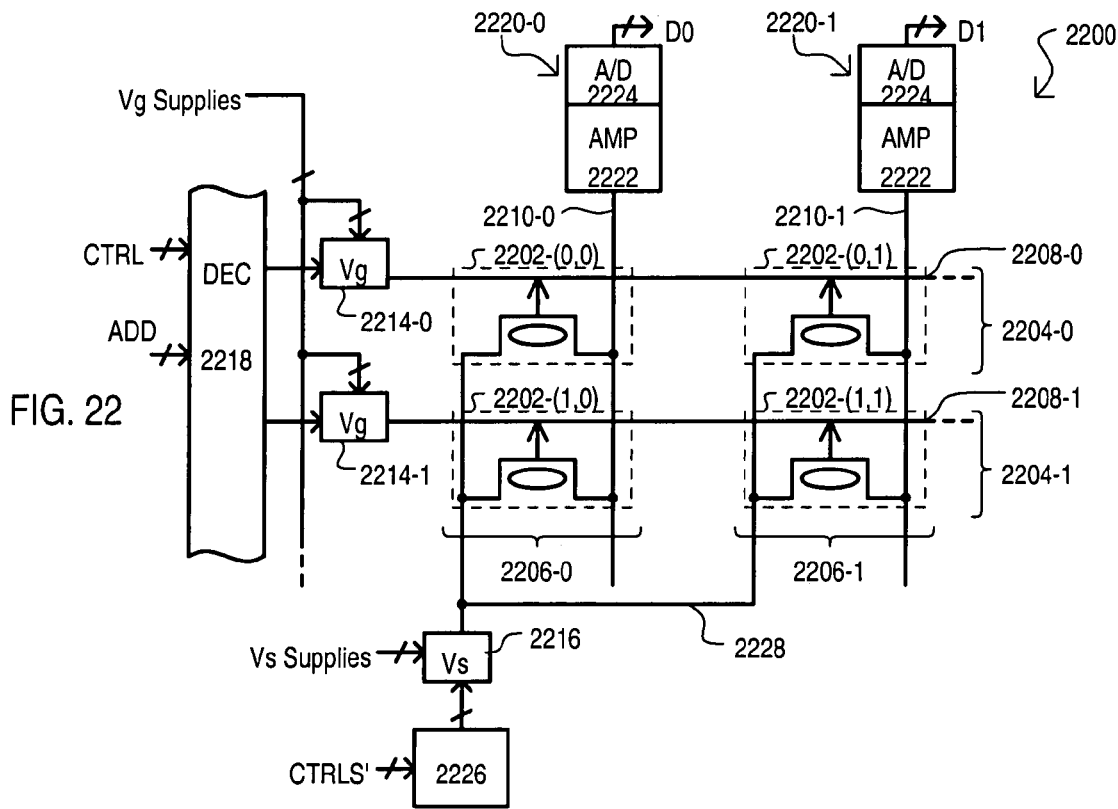
FIG. 22
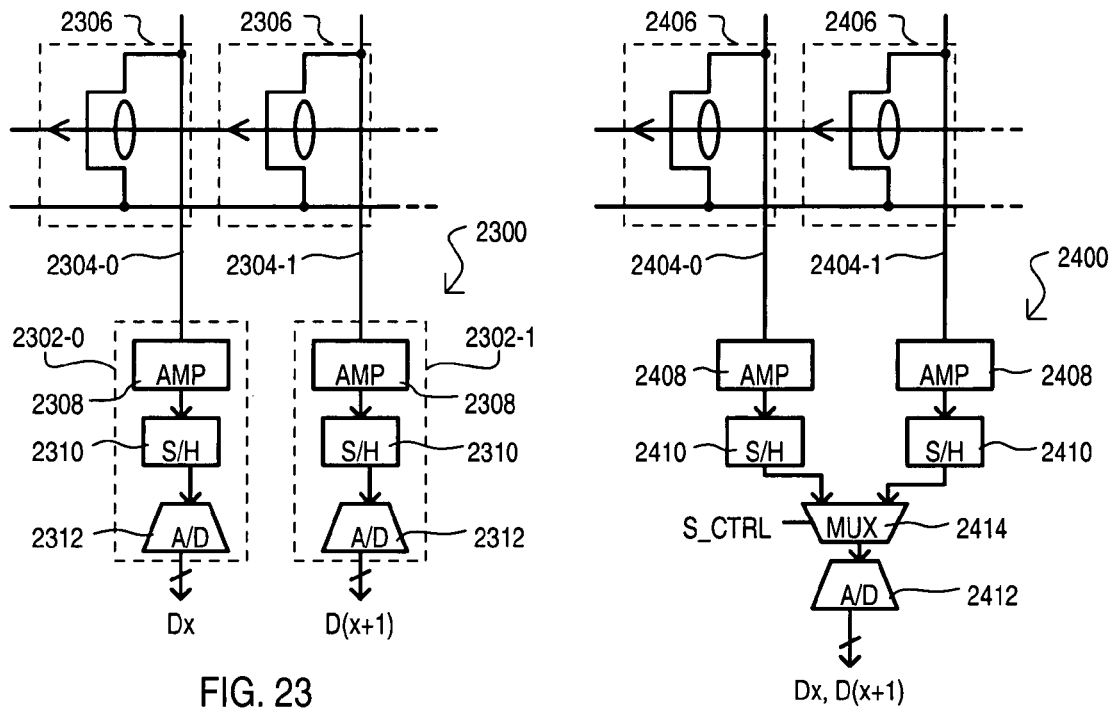
FIG. 23
FIG. 24

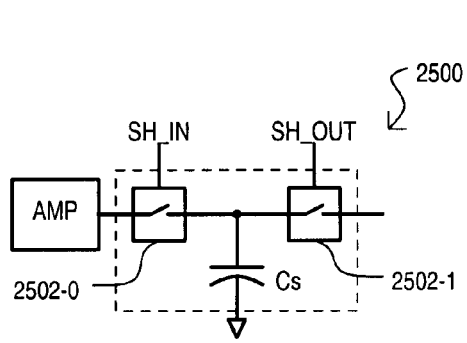
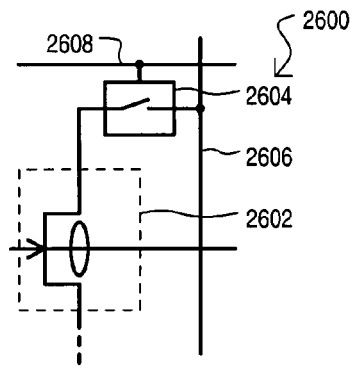
FIG. 25　　　　　FIG. 26
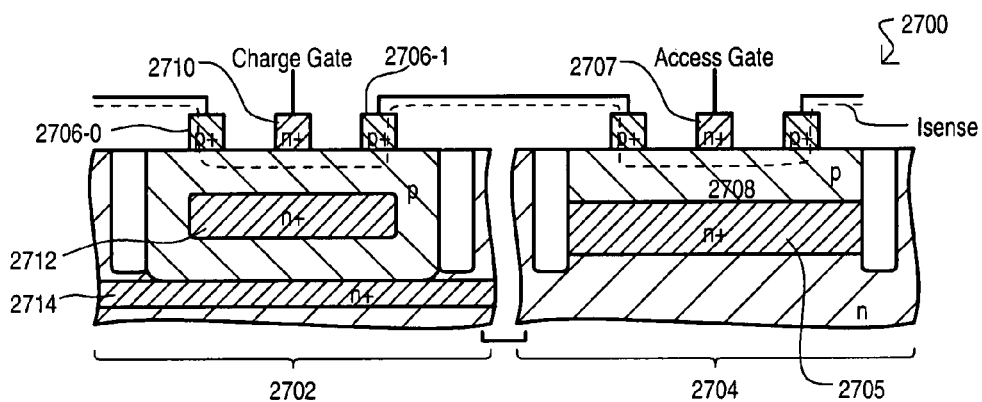
FIG. 27
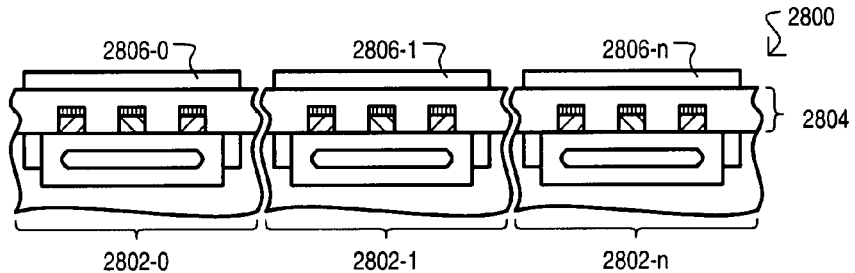
FIG. 28
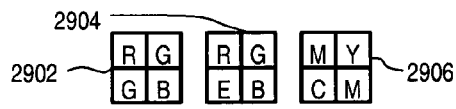
FIG. 29
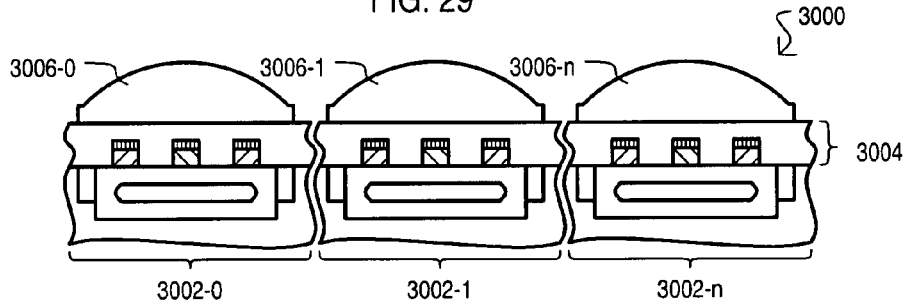
FIG. 30

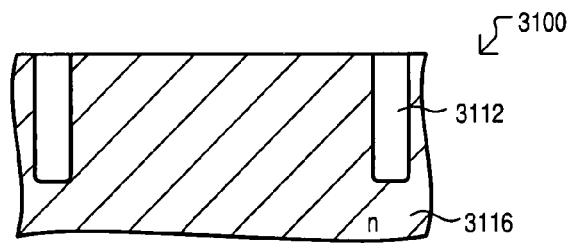
FIG. 31A
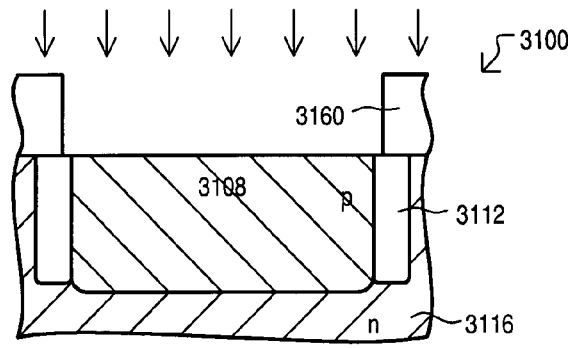
FIG. 31B
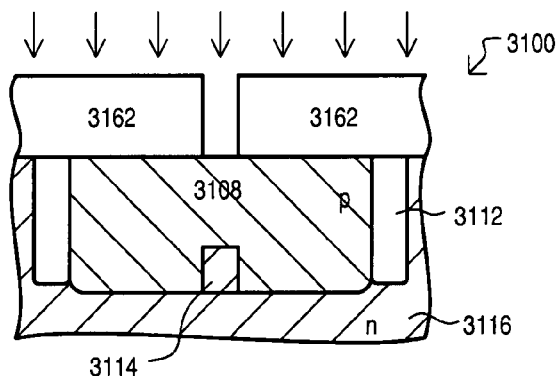
FIG. 31C
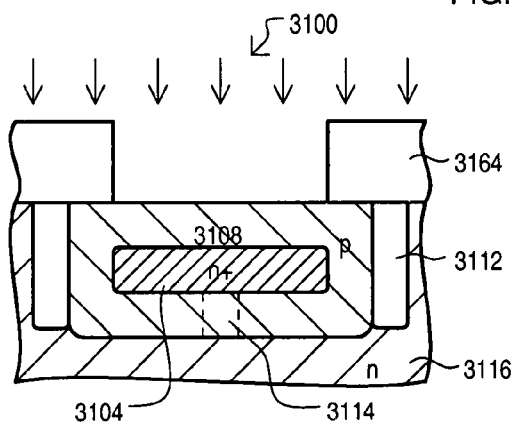 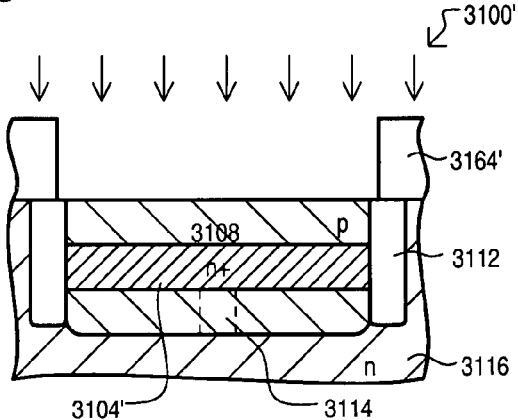
FIG. 31D-0                    FIG. 31D-1

IMAGE SENSING CELL, DEVICE, METHOD OF OPERATION, AND METHOD OF MANUFACTURE

TECHNICAL FIELD

The present invention relates generally to image sensing devices, and more particularly to an image sensing device having a semiconductor channel with a resistance that can vary according to exposure to light.

BACKGROUND OF THE INVENTION

Conventional image sensor devices typically include an array of image sensing cells, each of which can acquire an image picture element (pixel) or portion of a pixel. Conventional image sensors can include charge coupled device (CCD) type image sensors or "CMOS" type image sensors. CCD type image sensors can acquire a charge equivalent to image pixel data, and transfer such charge to read amplifiers. While CCD image sensors typically generate low noise images, such sensors can have relatively high power consumption and introduce a substantial "lag" time into image acquisition.

CMOS type image sensors can provide favorable power consumption performance as compared to CCD type sensors. However, a typical CMOS image sensor cell can be more susceptible to noise and can have less image acquisition area than a CCD type sensor cell. This may be particularly true for CMOS image sensor cells that utilize active pixel sensing. Active sensing pixel cells typically include three or more transistors in addition to a photosensing structure, such as a photodiode.

BRIEF SUMMARY OF THE INVENTION

An image sensing device can include one or more image sensing cells. Each image sensing cell can have a charge store element formed from a semiconductor material doped to a first conductivity type. The charge store element can be in contact with a channel region formed from a semiconductor material doped to a second conductivity type. The charge store element can have one or more surfaces for exposure to an image source. Each image sensing cell can also include a charge electrode formed from a semiconductor material doped to the first conductivity type that can be separated from the charge store element by a semiconductor material doped to the second conductivity type. In addition, one or more current detection electrodes can be included in each image sensing cell. A current detection electrode can pass a current flowing through the channel region in a read operation.

The invention can also include a method of acquiring an image with an array of image sensing cells. The method can include charging a store electrode in each image sensing cell by punching through a semiconductor material doped to a first conductivity type to the store electrode, the store electrode comprising a material doped to a second conductivity type; enabling a light transmitting path to the image sensing cells; and determining a light intensity value for each image sensing cell based on a resistance of a channel region for the image sensing cell, the channel region being a semiconductor material doped to the first conductivity type adjacent to the store electrode.

The invention can further include a method of fabricating an image sensing cell. Such a method can include forming a charge storing region comprising a semiconductor material doped to a first conductivity type; forming a channel region adjacent to and in contact with at least a portion of the charge storing region, the channel region comprising a semiconductor material doped to a second conductivity type; forming a charge gate structure comprising a semiconductor material doped to a first conductivity type and separated from the charge storing region by a semiconductor material doped to the second conductivity type; and forming a light altering structure over at least the charge storing region.

BRIEF DESCRIPTION OF THE DRAWINGS

FIG. 3 is a side cross sectional view of an image sensing cell according to another embodiment of the present invention.

FIG. 4 is a side cross sectional view of an image sensing cell according to another embodiment of the present invention.

FIGS. 5A and 5B are views showing an image sensing cell according to another embodiment of the present invention.

FIGS. 6A and 6B are schematic diagram representations of image sensing cells according to embodiments of the invention.

FIGS. 7A and 7B are schematic diagram representations of image sensing cells having a first type reset capability according to embodiments of the invention.

FIGS. 8A and 8B are schematic diagram representations of image sensing cells having a second type reset capability according to embodiments of the invention.

FIGS. 9A and 9B are symbolic representations of image sensing cells according to various embodiments.

FIGS. 10A and 10B show a charge operation according to an embodiment.

FIG. 11 shows a retention operation according to an embodiment.

FIG. 12 shows an acquisition operation according to an embodiment.

FIG. 13 is a graph showing a relationship between channel resistance and exposure time.

FIG. 14 shows a read operation according to an embodiment.

FIGS. 15A and 15B show read de-select operations according to embodiments.

FIG. 22 shows an image sensing device according to another embodiment.

FIG. 23 shows a conversion circuit that can be included in embodiments of the invention.

FIG. 24 shows another conversion circuit that can be included in embodiments of the invention.

FIG. 25 shows a sample and hold circuit that can be included in the embodiments.

FIG. 26 shows an image sensing cell having an access device according to an embodiment.

FIG. 27 shows an image sensing cell having an access device according to another embodiment.

FIG. 28 shows an image sensing device according to another embodiment.

FIG. 29 shows color filter arrangements that can be included in the embodiments.

FIG. 30 shows an image sensing device according to yet another embodiment.

FIGS. 31A to 31I show methods of manufacturing image sensing cells according to embodiments of the invention.

DETAILED DESCRIPTION OF THE EMBODIMENTS

Various embodiments of the present invention will now be described in detail with reference to a number of drawings. The embodiments show structures, methods of operation, and methods of manufacture for an image sensing cell and/or device that can be compact in size as compared to conventional image sensor cells.

Figures 1A, 1B, 1C:
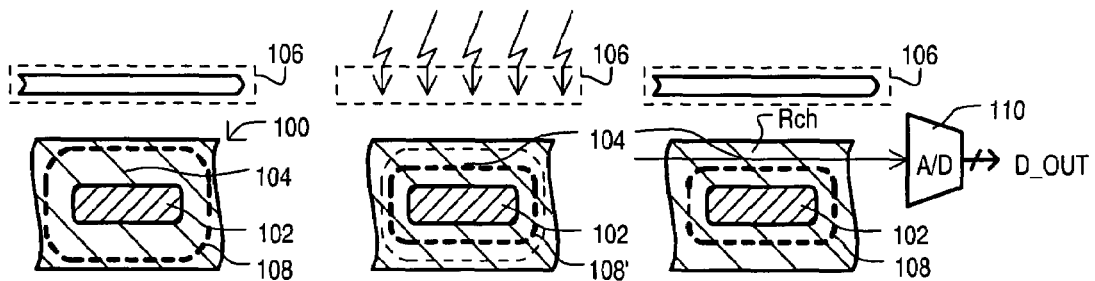
FIGS. 1A to 1C are views showing an image sensing cell and operation according to a first embodiment of the present invention.

Referring now to FIGS. 1A to 1C, an image sensor cell and operation is shown in a series of views. An image sensor cell 100 can include a store structure 102 and an adjacent channel region 104. A store structure 102 can be formed from a semiconductor material doped to a first conductivity type. A store structure 102 can be surrounded by a semiconductor material doped to an opposite conductivity type, or a combination of such an oppositely doped material and an electrical isolation material. In such an arrangement, a store structure 102 can be charged to a reverse biased condition with respect to the oppositely doped channel material, and thus retain such charge for a period of time.

A store structure 102 can also face a controllable aperture 106. A controllable aperture can selectively expose a store structure 102 to light for an image, allowing store structure 102 to capture image data therefrom.

A channel region 104 can be formed from a semiconductor material doped to a different conductivity type than store structure 102. In such an arrangement, if store structure 102 is charged in a reverse bias fashion, a depletion region 108 can extend from store structure 102 and into channel region 104. In the absence of such a depletion region (e.g., store structure 102 is discharged), a channel region 104 can have a certain resistance. However, in the presence of a depletion region, a channel resistance can increase. In particular, the greater the amount of charge stored on store structure 102, the greater the channel resistance.

FIG. 1A shows image sensor cell 100 prior to an image acquisition operation. A store gate 102 has been charged to produce depletion region 108. Further, aperture 106 can be closed, preventing light from contacting store structure 102.

FIG. 1B shows image sensor cell 100 during an image acquisition operation. Aperture 106 can be opened allowing light to contact the image sensor cell 100. As a result, electron-hole pairs can be generated that can reduce the depletion region created by charged store gate 102. A rate at which such a depletion region shrinks can be dependent upon the electron-hole pair generation rate. Such a generation rate can be dependent upon the intensity of light contacting the image sensor cell 100. Thus, in response to an acquisition operation, a resulting resistance of channel region 104 can vary according to intensity of received light. In the particular example of FIG. 1B, an image acquisition step results in decreased depletion region 108'.

FIG. 1C shows an image sensor cell 100 during a read operation that follows an acquisition operation. Aperture 106 can be closed to prevent any more light from contacting the image sensor cell 100. As shown in FIG. 1C, a channel region 104 can have a resistance Rch. The value of resistance Rch can be detected according to a voltage or current, and the resulting value converted from analog to digital form by an analog-to-digital (A/D) converter 110. A/D converter 110 can output multi-bit value D_OUT, which can correspond to a detected light intensity.

In this way, an image sensor cell can have a channel resistance that varies according to light intensity.

Having described an image sensor cell and operation, particular image sensor cell structures will now be described.

Figures 2A, 2C:
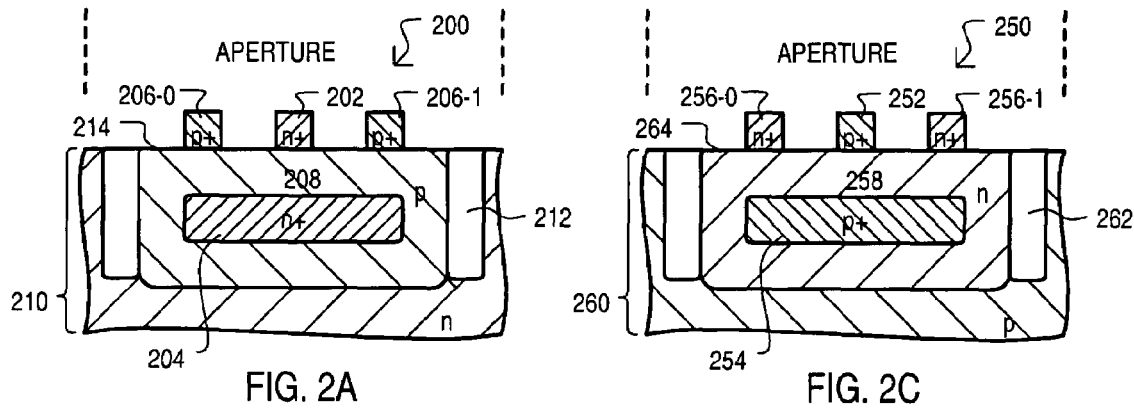
FIGS. 2A to 2C are various views showing image sensing cells according to other embodiments of the present invention.
Figure 2B:
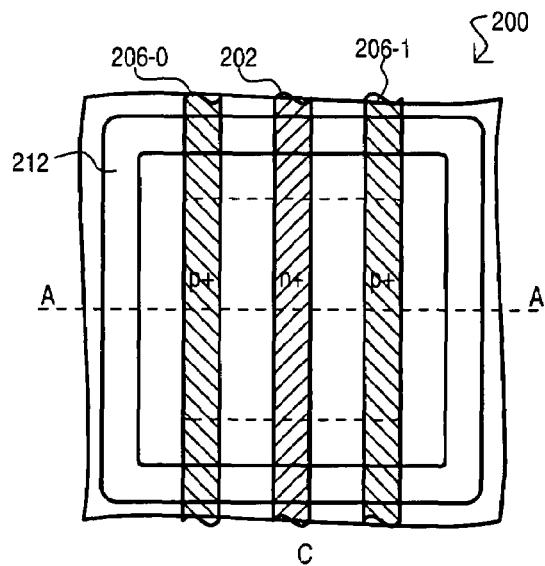

Referring now to FIGS. 2A and 2B, an image sensor cell according to an embodiment is shown in two views, and designated by the general reference character 200. FIG. 2B is a top plan view. FIG. 2A shows a side cross sectional view of image sensor cell 200 taken along line A-A of FIG. 2B.

An image sensor cell 200 can include a charge gate 202, a store structure 204, a first read electrode 206-0, a second read electrode 206-1, and a channel region 208. An image sensor cell 200 can be formed in a substrate 210, and can be bounded by an isolation structure 212. A substrate surface 214 can face an aperture opening.

A charge gate 202 can be patterned from a semiconductor layer formed on a substrate surface 214, and can be doped to one conductivity type (in this example, n-type). In the particular example shown, charge gate 202 can extend over, and be in physical contact with channel region 208 between opposing ends of isolation structure 212.

A store structure 204 can be formed from a semiconductor material doped to a same conductivity type as charge gate 202, and can be separated from charge gate 204 by a semiconductor material of opposite doping type (in this case p-type channel 208). Further, a store structure 204 can be adjacent to a channel region 208, and thus can vary the resistance of channel region 208 according to the amount of charge stored by store structure 204.

In the very particular example of FIG. 2A, a store structure 204 can be highly doped n+ region within, and surrounded by, a p-type substrate area that includes channel region 208.

First and second read electrodes (206-0 and 206-1) can be doped to a conductivity type opposite to that of charge gate 202, and separated from one another by channel region 208. In the very particular example of FIG. 2A, first and second read electrodes (206-0 and 206-1) can be patterned from a semiconductor layer formed on a surface of a substrate 210, and preferably patterned from the same layer as charge gate 202.

In such an arrangement, an image sensor cell 200 can be conceptualized as including a junction field effect transistor (JFET) having a channel between first read electrode 206-0 and second read electrode 206-1, the conductivity of which can be controlled by a potential applied to charge gate 202, the amount of charge stored on store structure 204, or both.

In a preferred embodiment, an image sensor cell 200 can be composed of doped silicon sections. In particular, a substrate 210 can be a monocrystalline silicon substrate that includes a relatively lightly doped channel region 208 and heavily doped store structure 204. In addition, charge gate 202 and first and second read electrodes (206-0 and 206-1) can include heavily doped polycrystalline silicon (polysilicon) or amorphous silicon. In such an arrangement, a charge gate 202 and read electrodes (206-0 and 206-1) may also include portions of the substrate directly below, resulting from outdiffusion of dopants or a separate source/drain doping step. That is, a charge gate 202 can include a very shallow, heavily doped n+ region extending into substrate 210. Similarly, read electrodes (206-0 and 206-1) can include heavily doped p+ region extending into substrate 210.

While FIGS. 2A and 2B show an image sensor cell 200 having a p-channel JFET configuration, other embodiments can include an n-channel JFET configuration having conductivity types opposite to that shown in FIGS. 2A and 2B. One such embodiment is shown in FIG. 2C.

FIG. 2C shows a storage having the same general configuration as FIG. 2A, thus like items are referred to by the same reference character but with the first digits being "25" or "26" instead of a "20" or "21". The image sensor cell 250 of FIG. 2C can differ from that of FIG. 2A in that semiconductor structures can be doped to an opposite conductivity type.

Referring now to FIG. 3, an image sensor cell according to another embodiment is shown in a series of views, and designated by the general reference character 300. FIG. 3 shows the same general views as FIG. 2A. Further, an image sensor cell 300 can include some of the same general structures as image sensor cell 200. Accordingly, like structures will be referred to by the same reference character but with the first digit being a "3" instead of a "2".

Image sensor cell 300 can differ from that of FIGS. 2A and 2B in that a store structure 304 is not completely surrounded by oppositely doped semiconductor material, and can abut isolation structure 312. While such an arrangement can result in charge leaking from store structure 304 at a greater rate than embodiments like that of FIGS. 2A to 2C, such a structure may be more easily manufactured, by requiring fewer masks, or may provide more uniform performance as a store structure position 304 may vary less according to mask alignment.

Referring now to FIG. 4, an image sensor cell according to another embodiment is shown in a side cross sectional view, and designated by the general reference character 400. FIG. 4 shows the same general views as FIG. 2A. Further, an image sensor cell 400 can include some of the same general structures as image sensor cell 200. Accordingly, like structures will be referred to by the same reference character but with the first digit being a "4" instead of a "2".

Image sensor cell 400 can differ from that of FIGS. 2A and 2B in that it can include a discharge channel 416. A discharge channel 416 can be formed from a semiconductor material and situated between a store structure 404 and a bulk portion 418. A discharge channel 416 can be lightly doped to the same conductivity type as a store structure 404. A bulk portion 418 can be doped to the same conductivity type as store structure 404, but at a higher concentration than that of discharge channel 416. In particular arrangements, a bulk portion 418 can be a starting monocrystalline substrate, or can be a well formed within a substrate by a doping step, such as an ion implantation step.

As will be described in more detail below, a discharge channel 416 can serve to discharge store structure 404 to bulk portion 418 in a reset operation. Discharge channel 416 can operate as the channel of a JFET device (oriented in the vertical direction). When charge is to be preserved on store structure 404, a discharge channel 416 can be non-conducting. When a store structure 404 is to be discharged, discharge channel 416 can be conducting. The state of discharge channel 416 (i.e., conducting/non-conducting) can be controlled by application of voltages to either or both of read electrodes 406-0, 406-1.

An image sensing cell 400 can include a store structure like that of FIG. 3, and thus FIG. 4 shows such a store structure 404' with dashed lines.

While the various embodiments described above have shown arrangements in which read electrodes (e.g., source/drains) can be formed above a substrate surface. Alternate embodiments can include electrodes formed by diffusion regions within a substrate. One such arrangement is shown in FIGS. 5A and 5B.

FIGS. 5A and 5B show an image sensing cell 500 with the same general views as FIGS. 2A and 2B. Further, an image sensing cell 500 can include some of the same general structures as storage cell 200. Accordingly, like structures will be referred to by the same reference character but with the first digits being "5" instead of a "2".

Image sensing cell 500 can differ from that of FIGS. 2A and 2B in that a first read electrode 506-0 and second read electrode 506-1 can be formed by diffusion regions within substrate 510. As but one example, such read electrodes (506-0 and 506-1) can be formed by an ion implantation step that is self-aligned with charge gate 502.

In addition, FIG. 5A shows an image sensing cell that can be more suitable for manufacture with conventional metal-oxide-semiconductor (MOS) type manufacturing methods. Thus, a charge gate 502 can have surrounding isolation structure including "sidewalls". In such an arrangement, read electrodes (506-0 and 506-1) can be formed by a self-aligned ion implantation step performed prior to the formation of such sidewalls, after the formation of such sidewalls, or both.

As in the case of FIG. 4, an image sensing cell 500 can include a store structure like that of FIG. 3, thus FIG. 5 shows such a store structure 504' with dashed lines. Further, a discharge channel can optionally be included, and so is shown by dashed lines and reference character 516.

In this way, an image sensing cell can be formed in a semiconductor substrate and include electrodes formed on or within such a substrate.

It is noted that in structures like those shown in FIGS. 2A to 5B, storage cell structures can be repeated adjacent to one another to provide compact memory arrays. For example, a charge gate can be a contiguous structure extending across multiple storage cells to form a common row gate line. Similarly, either or both of read electrodes can extend in a similar fashion to provide a common row read line or common column data line for multiple storage cells. Such an arrangement can provide for compact array designs.

Of course, in alternate embodiments, a control gate and/or source/drain need not extend over an isolation structure, and can be formed entirely within an active area region. Such structures can then be connected to other structures by one or more layers of contacts, interconnect wirings and/or vias.

Still further, in arrangements like that shown above, essentially all of an image sensing cell can represent an imaging area. This is contrast to conventional active pixel sensing arrangements that include cell area dedicated to control devices (i.e., preset and access transistors) rather than a photosensing diode, or other photosensitive device. Thus, image sensing cells according to the embodiments can be advantageously efficient in area usage.

Referring now to FIGS. 6A and 6B, image sensing cells according to embodiments are represented in a first schematic diagram form.

Image sensing cell 600 of FIG. 6A can correspond to any of the structures shown in FIGS. 2A/2B, 3 or 5A/B. Storage cell 600 includes labels to corresponding structures shown in the previous embodiments, but with the first digit being a "6" instead of any of 2, 3 or 5. Image sensing cell 650 of FIG. 6B, has the same general structure as that of FIG. 6A, but with opposite conductivities for the various structures. Thus, FIG. 6B can correspond to the embodiment shown in FIG. 2C FIGS. 6A and 6B show how an image sensing cell (600 or 650) can be conceptualized as including a sense JFET with a channel region having a resistance modulated according to a pn junction (shown as a diode). Such a pn junction can have a depletion region that varies according to exposure to light.

As noted above with respect to FIG. 4, and as will be described in more detail below, in some embodiments it may be desirable to "reset" image sensing cells by discharging a storage structure. Embodiments having a reset capability will now be described.

Referring now to FIGS. 7A and 7B, image sensing cells having a first type reset capability are shown in schematic diagrams. FIG. 7A shows a p-channel variation and can have the same general structures as FIG. 6A. Similarly, FIG. 7B shows an n-channel variation and can have the same general structures as FIG. 6B. Thus, corresponding structures have the same label, but with the first digit being a "7" instead of a "6".

Image sensing cells 7A and 7B can differ from those of FIGS. 6A and 6B in that at least one of the read terminals (in this case second read terminal 706-1/756-1) can induce a forward bias condition across the corresponding pn junction (708/704, 758/754). This can enable a store structure 704/754 to be discharged. Such a reset capability can be inherent in the embodiments described above.

Referring now to FIGS. 8A and 8B, image sensing cells having a second type reset capability are shown in schematic diagram form.

Image sensing cell 800 of FIG. 8A can correspond to the structure shown in FIG. 4. Thus, storage cell 800 includes the same labels, but with the first digit being an "8" instead of a "4". Image sensing cell 850 of FIG. 8B, has the same general structure as that of FIG. 8A, but with opposite conductivities for the various structures.

Image sensing cells 8A and 8B can be different from that of FIGS. 6A to 7B in that a discharge JFET, of opposite conductivity type to the sense JFET, can be formed by a corresponding discharge channel 816/866 and bulk portion 818/868. Placing the discharge JFET into a conducting state can enable a store structure 804/854 to be discharged.

In this way, image sensing cells can include reset capability that discharges a corresponding store structure, thus eliminating any image data stored therein.

FIG. 9A shows a schematic symbol for a p-channel image sensing cell according to embodiments described herein and equivalents. FIG. 9B shows a schematic symbol for an n-channel image sensing cell according to embodiments described herein and equivalents.

While the above embodiments have described image sensing cells according to various embodiments, other embodiments can include image sensing cell operating methods. Such operations can include, without limitation, charge operations that can place charge onto a storage structure, retention operations that can preserve a charged state of a storage structure, acquisition operations that can acquire image data by varying the amount of charge on a storage structure according to intensity of received light, read operations that can determine an image sensing cell channel resistance, read de-select operations that can isolate an image sensing cell from a read operation, and reset operations that can discharge a storage structure.

Particular embodiments directed to such various operations will now be described.

A charge operation according to an embodiment can include applying a voltage to a charge gate and one or more read electrodes that results in "punchthrough" to a store structure. That is, a voltage can be applied to a charge gate that causes a depletion region to form in an oppositely doped area between a charge gate and store structure. Such a voltage is sufficient to cause the depletion region to extend to the store structure (the punchthrough state) creating a conductive channel from the control gate to the store structure. As a result, a store structure can be charged according to the potential applied to a charge gate.

Referring now to FIGS. 10A and 10B, one very particular example of a charge operation for an image sensing cell like that of FIGS. 2A and 2B is shown in a series of two side cross sectional views. The image sensing cell shown and corresponding structures are labeled with the same reference characters as FIG. 2B.

FIG. 10A shows an image sensing cell 200 just prior to punchthrough. Because image sensing cell 200 is an n-channel type, a positive voltage can be applied to n-type charge gate 202 to create a depletion region 1000-0 within channel region 208. At the same time, a negative voltage can be applied to p-type second read electrode 206-1. A charge gate voltage at this time can be less than that required for punchthrough, thus a depletion region 1000-0 does not yet extend to store structure 204.

FIG. 10B shows an image sensing cell 200 in a punchthrough state. A charge gate 202 voltage is now sufficient to create depletion region 1000-1 that extends through channel region 208 to store structure 204. Consequently, store structure 204 can be charged (in this case to a more positive potential).

In the particular example of FIGS. 10A and 10B, during such a charge operation, first read electrode 206-0 can be maintained at potentials or states that can enable punchthrough to occur at a desired charge gate voltage.

The example of FIGS. 10A and 10B sets forth particular voltages and states for a charge operation, with punchthrough charge gate voltage being about +5.0 V, a first read electrode being at about −5.0 V, and a drain being maintained at 0 V or placed into a high impedance state. However, such particular potentials are provided by way of example only. One skilled in the art would recognize punchthrough voltages will vary according to any of: doping concentrations, image sensing cell dimensions, particular source/drain states or potentials, as well as other factors.

Of course, a write operation like that shown in FIGS. 10A and 10B could be implemented in the same general fashion for image sensing cells having other structures described herein, and equivalents. As but one example, in an n-channel image sensing cell, a negative voltage could be applied to a charge gate while a positive voltage can be applied to a first read electrode.

Referring still to FIGS. 10A and 10B, during a charge operation, an aperture 1002 can be opaque, preventing light from being received by image sensing cell 200.

In this way, an image sensing cell can have a store structure initially charged to a reverse bias state. Such a charged store structure can create a high resistance channel.

While embodiments of the present invention can include methods for charging image sensing cell, embodiments of the present invention can also include methods for retaining a state of storage structure both prior to and after an image acquisition operation. A retention operation according to an embodiment can include applying voltages to a charge gate and read electrodes that can tend to preserve a charge state of a store structure.

Referring now to FIG. 11, one particular example of a store operation for an image sensing cell like that of FIGS. 2A and 2B is shown in a side cross sectional view. The image sensing cell shown is labeled with the same reference characters as FIG. 2A.

FIG. 11 can represent an image sensing cell following a charge operation like that shown in FIGS. 10A and 10B. A voltage applied to charge gate 202 can be less than that for punchthrough. As a result, a charge placed on store structure 204 can create a depletion region 1100 that extends into channel region 208. Such a depletion region 1100 can increase a channel resistance over that resulting from a discharged store structure.

While FIG. 11 shows a retention operation following a charge operation, the same retention operation can be executed after an acquisition operation (described below) to retain image data for subsequent read out and conversion to a digital value.

The example of FIG. 11 shows particular voltages and states for a store operation. A charge gate voltage can be about +1.0 V, a first read electrode can be maintained at about 0 V, and a second read electrode can be maintained at about 0 V or placed into a high impedance state. However, such particular potentials are provided by way of example only.

In the data retention operation shown, an aperture 1002 can be opaque, preventing light from being received by image sensing cell 200 and thus changing the extent of a stored depletion region 208.

In this way, an image sensing cell can retain a charged state of a corresponding store structure.

Embodiments of the present invention can also include image acquisition operations. According to an embodiment, an image acquisition operation can include opening an aperture to expose an image sensing cell having a charged storage structure to a potential light source. Light impinging on the exposed image sensing cell can generate electron-hole pairs that can decrease the depletion region created by the store structure, and thus capture image data.

Referring now to FIG. 12, an example of an acquisition operation for an image sensing cell like that of FIGS. 2A and 2B is shown in a side cross sectional view. The image sensing cell shown and corresponding structures are labeled with the same reference characters as FIG. 2A.

In an acquisition operation, an aperture 1002 can be open, resulting in image sensing cell 200 being exposed to any light from the surrounding environment. If light of sufficient energy contacts the image sensing cell 200, a depletion region can shrink from a previous extent (represented by 1100) to a smaller extent, shown as 1200. It is understood that depletion region 1200 can represent image data, such as a picture element (pixel) or portion of a pixel, as its extent can correspond to detected light intensity.

As noted above, following an acquisition operation, an image sensing cell 200 can be subject to a retention operation, like that of FIG. 11, to preserve acquired image data.

Referring now to FIG. 13, a graph is shown that illustrates image acquisition for image sensing cells according to disclosed embodiments. FIG. 13 shows how a channel resistance (Y-axis) can vary in response to exposure time (X-axis). As exposure time increases, channel resistance falls due to a decrease in the size of the store structure depletion region. FIG. 13 also shows responses for varying intensities of light I1, I2, I3, where I1<I2<I3.

Accordingly, given a constant acquisition time, shown as t1, a resulting channel resistance can vary according to intensity of light.

In this way, an image sensing cell can reduce an amount of charge on store structure according to the intensity of received light.

While embodiments of the invention can include charge, retain and/or acquisition operations, the embodiments can also include read operations. In a read operation according to an embodiment, a channel resistance can be detected to thereby determine an image data value (e.g., pixel intensity). Such an operation can include creating a potential between read electrodes and determining the value of a result current flowing through a channel and/or providing a known current to the channel and determining a resulting potential generated across the read electrodes.

Referring now to FIG. 14, a read operation for an image sensing cell is shown in a side cross sectional view. Such a read operation can occur after an acquisition operation, like that shown in FIG. 12. FIG. 14 shows an image sensing cell like that of FIGS. 2A and 2B, thus like structures are labeled with the same reference characters as FIG. 2B.

In the read operation of FIG. 14, a first read electrode 206-0 can be placed at a higher potential than a second read electrode 206-1. A charge gate 202 can receive a voltage that can additionally limit current through a channel region 208. As shown FIG. 14, a channel region 208 can include a resistance Rch that will vary according the amount of charge on store structure 204.

The example of FIG. 14 shows a charge gate voltage from 0 to +1.0 V, a first read electrode voltage of +0.5 V, and a second read electrode voltage of 0V. However, such particular potentials are provided by way of example only. At the same time, it is noted that a read electrode potential must not exceed the forward bias potential of the pn junction created by first read electrode 206-0, channel 208 and store structure 204, or store structure 204 can discharge, losing acquired image data.

In the read operation shown, an aperture 1002 can be opaque, preventing light from being received by image sensing cell 200.

In this way a stored image data value can be determined according to a variation in channel resistance.

While embodiments of the present invention can include methods for reading a data state from an image sensing cell, it can also be desirable to "de-select" an image sensing cell from a read operation, to thereby enable different values to be read from image sensing cells having a common first read electrode and/or second read electrode connection.

A read de-select operation according to an embodiment can include preventing or significantly reducing a current from flowing through a channel of a de-selected image sensing cell. Thus, while multiple image sensing cells can be connected to a same node (e.g., a data line), de-selected image sensing cells can draw an insignificant amount of current as compared to a selected image sensing cell.

Referring now to FIGS. 15A and 15B, two particular examples of possible "read de-select" operations for an image sensing cell like that of FIGS. 2A and 2B are shown in side cross sectional views. The image sensing cells shown in the figures have corresponding structures labeled with the same reference characters as FIG. 2B.

FIG. 15A shows a first example of a read de-select operation. As is the case of a selected image sensing cell like that of FIG. 14, a first read electrode node 206-0 can be placed at a bias potential and charge gate 202 can receive a voltage that can additionally limit current through a channel region 208.

However, unlike the arrangement of FIGS. 14A and 14B, a second read electrode node 206-1 can be placed into a high impedance state. As a result, little or no current can flow through a channel region 208. Accordingly, the de-selected image sensing cell 200 can contribute little or no current to another image sensing cell sharing a connection to first read electrode 206-0.

FIG. 15B shows a second example of a read de-select operation. As is the case of a selected image sensing cell like that of FIGS. 14, a first read electrode node 206-0 can be placed at a bias potential, and second read electrode node 206-1 can be placed at ground. This can create a potential across a channel region 208. However, in the operation shown, a de-select gate voltage can be applied to charge gate 202 that limits current through a channel region 208. Such a read de-select charge voltage can result in a depletion layer being formed in channel region 208, thereby significantly reducing current drawn by the deselected cell.

The example of FIG. 15B shows a charge gate de-select voltage of about +3.0 V. However, such a particular potential is provided by way of example only. A gate de-select voltage can vary according to doping and image sensing cell size. However, a charge structure de-select voltage should be of sufficiently small enough in magnitude to prevent punch-through.

In the two read de-select operations shown above, an aperture 1002 can be opaque, preventing light from being received by image sensing cell 200.

In this way, image data values can be selectively read from image sensing cells.

While embodiments of the present invention can include methods for charging an image sensing cell into a high channel resistance state, other embodiments can include operations that "reset" an image cell to a low channel resistance state, by discharging the store structure of the image sensing cells.

A reset operation according to one embodiment can include forward biasing a pn junction created by a store structure, and a channel region and first read electrode (and/or second read electrode). A resulting forward biased pn junction can create a discharge path that allows charge to transfer away from the store structure.

Figure 16:
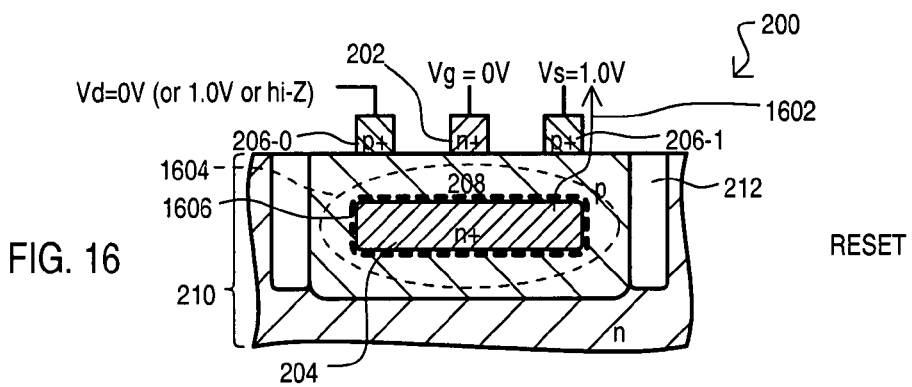
FIG. 16 shows a first type reset operation according to one embodiment.

Referring now to FIG. 16, one very particular example of a reset operation for a image sensing cell like that of FIGS. 2A and 2B is shown in a side cross sectional view. The image sensing cell shown is labeled with the same reference characters as FIG. 2B.

In the reset operation of FIG. 16, a voltage can be applied to second read electrode 206-1 that forward biases a pn junction created by a store structure 204 (n part of junction) and a channel 208 and second read electrode 206-1 (p part of junction). This can create charge travel path 1602. As a result, assuming a store structure 204 was previously charged to form a depletion region 1604, following a reset operation, charge structure 204 can be discharged and thus present an insignificant depletion region 1606 with respect to channel resistance.

The example of FIG. 16 shows particular voltages and states for a reset operation. A charge gate voltage can be about 0V, a first read electrode can be maintained at 0 V or placed into a high impedance state, while a second read electrode can be driven to a voltage sufficient to forward bias the pn junction, which in this example is +1.0 V. However, such particular potentials are provided by way of example only.

Of course, a reset operation like that shown in FIG. 16 could be implemented in the same general fashion for image sensing cells having other structures described herein, and equivalents. As but one example, in an n-channel image sensing cell, a negative voltage could be applied to a read electrode or read electrode to create a desired forward bias condition.

According to another embodiment, a reset operation can include enabling a discharge path between a store structure and a bulk portion in which the image sensing cell is formed. Such a discharge path can allow the store structure to discharge to the bulk portion. This is in contrast to the approach shown in FIG. 16, which forward biases a pn junction that includes a store structure.

Figure 17:
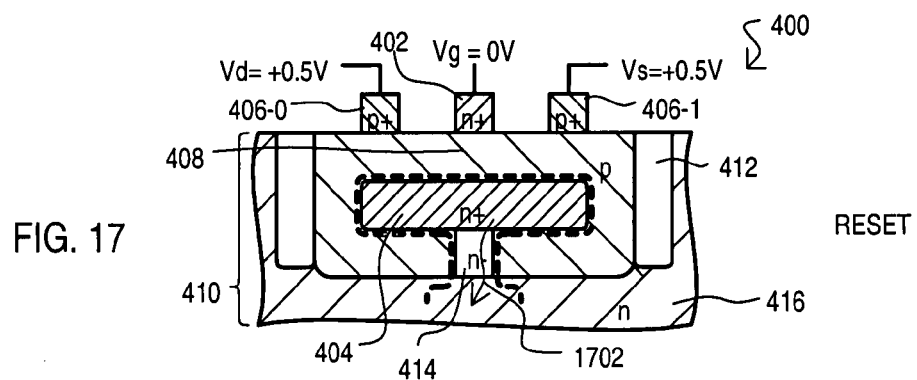
FIG. 17 shows a second type reset operation according to an embodiment.

Referring now to FIG. 17, an example of a reset operation for an image sensing cell like that of FIG. 4 is shown in a series of side cross sectional views. The image sensing cell shown and corresponding structures are labeled with the same reference characters as FIG. 4.

In the reset operation of FIG. 17, a store voltage applied at a first and/or second read electrode (406-0, 406-1) that has previously pinched off discharge path 414, can be changed to enable discharge path 414. For example, in the case of the p-channel device illustrated, a voltage applied to first and/or second read electrodes (406-0, 406-1) can be increased. (In the case of an n-channel device a store voltage would be decreased). As a result, discharge path 414 can be placed into a low impedance state, creating charge travel path 1702. It is assumed that bulk portion 416 is biased to a potential sufficient to draw charge off of store structure 404.

The example of FIG. 17 shows particular voltages for a reset operation. A charge gate voltage can be about 0 V, first read electrode and second read electrode can be about +0.5 V. However, such particular potentials are provided by way of example only. However, read electrode voltages should remain sufficiently small to prevent a forward bias condition with a store structure.

Of course, any of the above described operations could be implemented in the same general fashion for image sensing cells having other structures described herein, and equivalents. For example, for n-channel image sensing cells voltage values can be switched appropriately.

Having described storage cell structures and methods of operation according various embodiments, embodiments directed to image sensor device architectures that include such image sensing cells will now be described.

Figure 18:
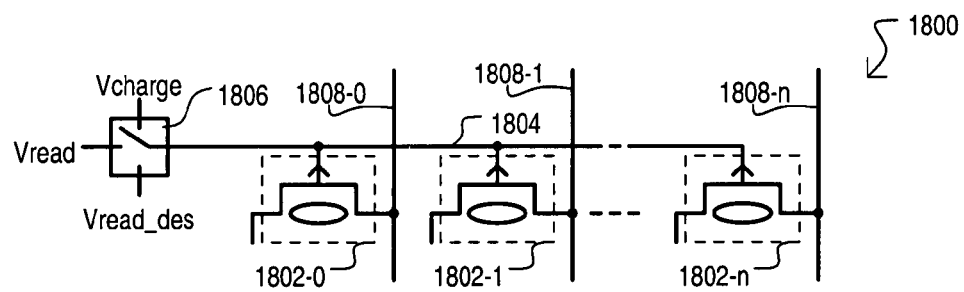
FIG. 18 is a schematic diagram of an image sensing device architecture according to an embodiment.

Referring now to FIG. 18, an image sensing device architecture according to an embodiment is shown in a block schematic diagram and designated by the general reference character 1800. Architecture 1800 shows a common gate architecture, and shows a number of image sensing cells 1802-0 to 1802-n, a charge row line 1804, and a charge row line switch 1806. Image sensing cells (1802-0 to 1802-n) can include any of the above image sensing cells shown herein or equivalents. Further, while the image sensing cells (1802-0 to 1802-n) are shown as p-channel type cells, other embodiments can include n-channel type cells. Each image sensing cell (1802-0 to 1802-n) can have a first read electrode connected to a corresponding data line (1808-0 to 1808-n), while charge gates of such image sensing cells can be commonly connected to charge row line 1804.

A charge row line switch 1806 can selectively connect charge row line 1804 to any of a charge potential (Vcharge), a read potential (Vread), or a read de-select potential (Vread_des). A charge potential (Vcharge), preferably in combination with a potential applied to one or both read electrodes, can enable a charge structures within image sensing cells (1802-0 to 1802-n) to be charged via punchthrough effect. This can enable multiple image sensing cells to be placed into a high channel resistance state essentially simultaneously.

A read potential (Vread), in combination with a potential applied to one or both read electrodes, can result in currents flowing through data lines (1808-0 to 1808-n) according to a channel resistance of the corresponding image sensing cells (1802-0 to 1802-n). This can enable data to be read from multiple image sensing cells via data lines essentially simultaneously. This is in contrast to CCD arrangements that can require charges to be transferred in a serial fashion to read circuits.

A read de-select potential (Vread_des), can place image sensing cells (1802-0 to 1802-n) into high resistance states, and thus limit the amount of current the image sensing cells (1802-0 to 1802-n) draw through data lines (1808-0 to 1808-n). This can prevent image sensing cells connected to data lines from interfering with the reading of data for other image sensing cells connected to the same data lines.

In this way, a row line common to charge gates of image sensing cells can be driven to execute various operations on the image sensing cells.

Figure 19:
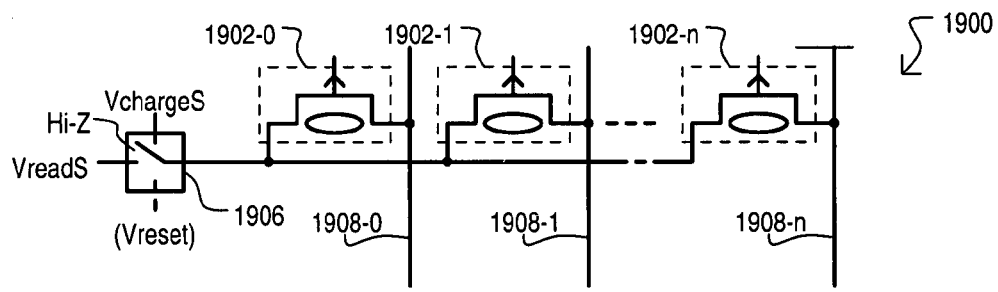
FIG. 19 is a schematic diagram of an image sensing device architecture according to another embodiment.

Referring now to FIG. 19, an image sensing device architecture according to another embodiment is shown in a block schematic diagram and designated by the general reference character 1900. Architecture 1900 shows a common read control line architecture, and can include a number of image sensing cells 1902-0 to 1902-n, a read row line 1904, and a read line switch 1906. Image sensing cells (1902-0 to 1902-n) can be subject to the same variation as those of FIG. 18. Each image sensing cell (1902-0 to 1902-n) can have a first read electrode connected to a corresponding data line (1908-0 to 1908-n). Second read electrodes of image sensing cells (1902-0 to 1902-n) can be commonly connected to read row line 1904.

A read row line switch 1906 can selectively connect read row line 1904 to any of a charge potential (VchargeS), a read potential (VreadS), or a high impedance node (Hi-Z). Optionally, a read row line switch 1906 can selectively connect read row line 1904 to a reset potential (Vreset).

A charge potential (VchargeS), preferably in combination with a potential applied to a charge gate, can enable a charge structure to be charged via punchthrough effect. This can enable multiple image sensing cells to be placed into a high channel resistance state essentially simultaneously.

A read potential (VreadS), preferably in combination with a potential applied to charge gate, can result in currents flowing through data lines (1908-0 to 1908-n) according to a channel resistance of the corresponding image sensing cells (1902-0 to 1902-n). Again, this can enable data to be read from multiple image sensing cells via data lines essentially simultaneously, in contrast to many conventional CCD arrangements.

A high impedance state can prevent image sensing cells (1902-0 to 1902-n) from drawing significant amounts of current through data lines (1908-0 to 1908-n). This can provide another way to prevent image sensing cells connected to data lines from interfering with the reading of data for other image sensing cells connected to the same data lines.

A reset potential (Vreset) can cause pn junctions within storage cells (1902-0 to 1902-n) to forward bias, and thus discharge storage structures within such cells. This can allow multiple image sensing cells to be placed into a low channel resistance state essentially simultaneously.

In this way, a row line common to read electrodes of image sensing cells can be driven to execute various operations on the image sensing cells.

Figure 20:
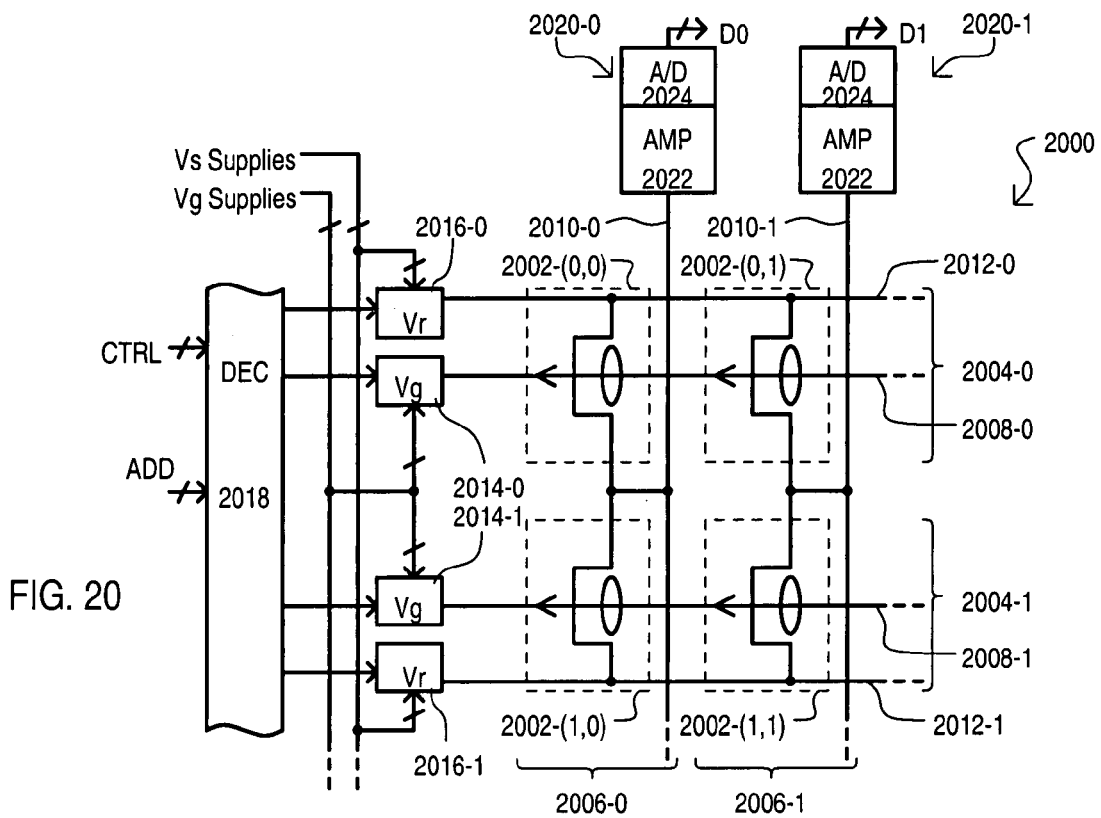
FIG. 20 shows an image sensing device according to an embodiment.

Referring now to FIG. 20, an image sensing device according to an embodiment is shown in a schematic diagram and designated by the general reference character 2000. An image sensing device 2000 can include a number of image sensing cells 2002-(0,0) to 2002-(1,1) arranged into rows 2004-0/1 and columns 2006-0/1. Image sensing cells of a same row can have charge gates commonly connected by a row line 2008-0 and 2008-1. Image sensing cells of a same column can have first read electrodes commonly connected by a data line 2010-0 and 2010-1. In the very particular example of FIG. 20, image sensing cells of a same row can also have second read electrodes commonly connected by a read row line 2012-0 and 2012-1.

An image sensing device 2000 can further include gate switch circuits 2014-0/1, row switch circuits 2016-0/1, a row decoder 2018, and conversion blocks 2020-0/1. Gate switch circuits 2014-0/1 can receive gate supply voltages (Vg Supplies) and selectively apply such voltages to charge gates of image sensing cells on a row-by-row basis according to control signals received from row decoder 2018. For example, charge gate voltages can be applied that are suitable for any of the operations described above, including but not limited to charge operations, retain operations, read operations, read de-select operations and reset operations.

In a similar fashion, row switch circuits 2016-0/1 can receive row supply voltages (Vr Supplies) and selectively apply such voltages to second read electrodes of image sensing cells on a row-by-row basis according to control signals received from row decoder 2018. In addition, row switch circuits 2016-0/1 can create a high impedance state for second read electrodes of the corresponding image sensing cells. For example, voltages can be applied to the second read electrodes, or the second read electrodes placed into a high impedance state, suitable for any of the operations described above, including but not limited to charge operations, retain operations, read operations, read de-select operations and reset operations.

A row decoder 2018 can receive address values ADD as well as control values CTRL, and in response thereto, control the operation of gate switch circuits 2014-0/1 and row switch circuits 2016-0/1. More particularly, according to such received values, a row decoder 2018 can distinguish between types of operations, allowing image sensing cells of a row to be charged, allowing reads from one row, while read de-selecting other rows, and/or allowing image sensing cells of a row to be reset.

Conversion blocks 2020-0/1 can each be connected to a corresponding data line 2010-0/1 and can amplify a current or voltage on such a line, and then convert the value into a digital value. In the very particular example of FIG. 20, each conversion block (2010-0/1) can include an amplifier 2022 and an A/D converter 2024.

In this way, image sensing cells can be arranged into an array to form an image sensing device.

Figure 21:
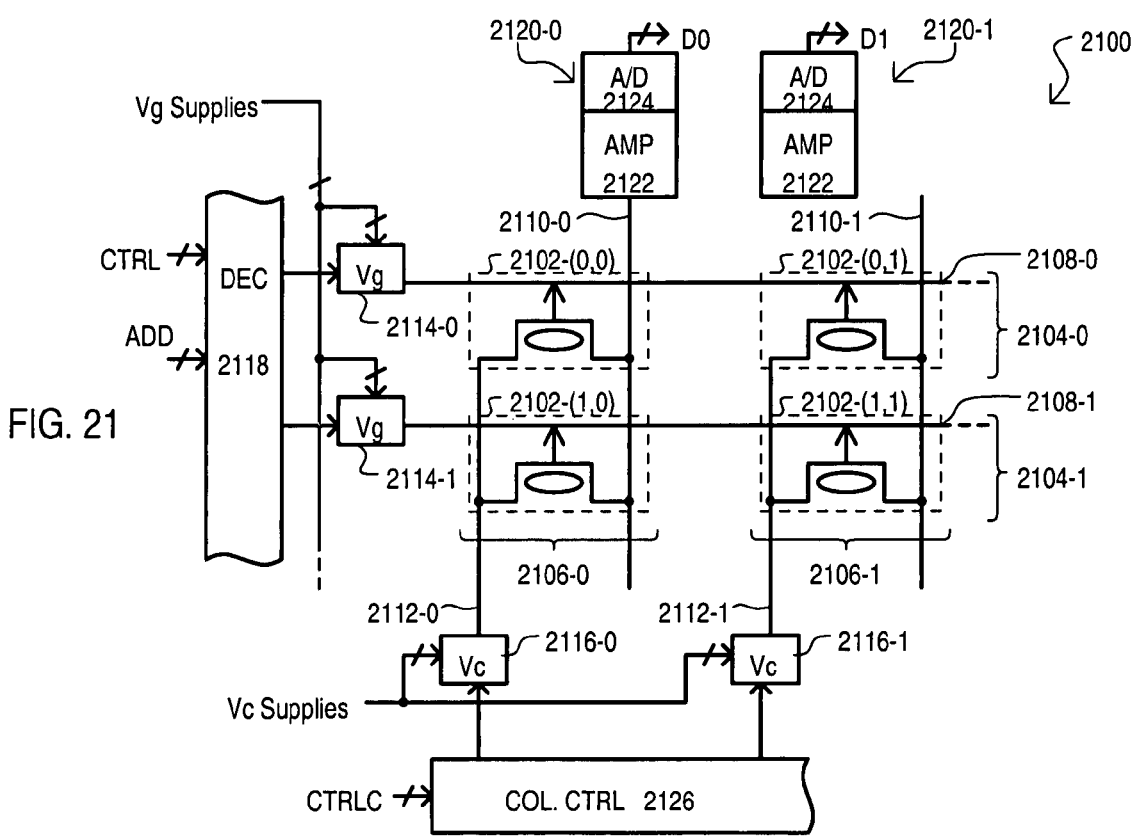
FIG. 21 shows an image sensing device according to another embodiment.

Referring now to FIG. 21 an image sensing device according to another embodiment is shown in a schematic diagram and designated by the general reference character 2100. An image sensing device 2100 can include many of the same general circuit sections as that of FIG. 20, accordingly, like sections are referred to by the same reference character but with the first two digits being "21" instead of "20".

Image sensing device 2100 can differ from that of FIG. 20 in that image sensing cells of a same column can have second read electrodes commonly connected by column lines 2112-0 and 2112-1, rather than storage cells of the same row.

In addition, column switch circuits 2116-0/1 can be controlled by a column control circuit 2126. A column control circuit 2126 can receive control values CTRLC, and in response thereto, control the operation of column switch circuits 2116-0/1. According to such received values, a column control circuit 2122 can distinguish between column operations, allowing reads from one column, while read de-selecting other columns and/or allowing resets of columns, while not resetting other columns.

Referring now to FIG. 22 an image sensing device according to another embodiment is shown in a schematic diagram and designated by the general reference character 2200. A image sensing device 2200 can include many of the same general circuit sections as that of FIG. 21, accordingly, like sections are referred to by the same reference character but with the first two digits being "22" instead of "21".

Image sensing device 2200 can differ from that of FIG. 21 in that image sensing cells from multiple rows and columns can have second read electrodes commonly connected to a common node 2228, rather than on a column-by-column basis. Such an arrangement can allow multiple rows and columns of image sensing cells to be charged (e.g., in combination with a suitable charge gate voltage) together. In addition, such an arrangement can allow for such multiple rows/columns to be reset together.

Of course, while the above image sensing device embodiments have shown arrays with p-channel type image sensing cells, alternate embodiments can include n-channel type storage cells.

In this way, image sensing cells can be arranged into an array to form various image sensing device architectures, including those that can control the operation of image sensing cells in a row-by-row basis, column-by-column basis, or multiple row and column basis.

Referring now to FIG. 23, a conversion circuit that can be included in the embodiments is shown in a block schematic diagram and designated by the general reference character 2300. A conversion circuit 2300 can include conversion blocks 2302-0/1, each corresponding to a given data line 2304-0/1. Each data line 2304-0/1 can be connected to one or more image sensing cells (two shown as 2306). In a read operation, as described above, image sensing cells 2306 can present a channel resistance corresponding to a sensed light intensity.

In the very particular example shown, each conversion block 2302-0/1 can include an amplifier circuit 2308, a sample and hold (S/H) circuit 2310, and an A/D circuit 2312. An amplifier circuit 2308 can be a current amplifier or voltage amplifier circuit depending upon the sensing technique used. A S/H circuit 2310 can sample a value generated by a corresponding amplifier circuit 2308 for subsequent processing by the corresponding A/D circuit 2312.

Referring now to FIG. 24, a conversion circuit according to another embodiment is shown in a block schematic diagram and designated by the general reference character 2400. A conversion circuit 2400 can include some of the same general sections as FIG. 23, thus like sections are referred to by the same reference character but with the first digits being "24" instead of "23".

A conversion circuit 2400 can differ from that of FIG. 23 in that an A/D circuit 2412 can be shared among multiple data lines (2404-0/1) (i.e., columns of image sensing cells 2406). In the particular example of FIG. 24, S/H circuits 2410 can provide output values to a multiplexer (MUX) 2414. According to control value S_CTRL, MUX 2414 can output a sampled value to A/D converter 2412. Of course, while FIG. 24 shows an A/D converter 2412 shared by two data lines, alternate arrangements can share more data lines.

Referring now to FIG. 25, one particular example of a S/H circuit that can be included in embodiments like that of FIGS. 23-24 is shown in a block schematic diagram and designated by the general reference character 2500. A S/H circuit 2500 can include an input switch 2502-0, a sample capacitor Cs, and an output switch 2502-1. In operation, an input switch 2502-0 can be enabled (provide low impedance) to allow sample capacitor Cs to be charged according to a resistance of an image sensing cell being read. Such an input switch 2502-1 can then be disabled (provide a high impedance). An output switch 2502-1 can then be enabled to allow the sampled voltage to be output for subsequent processing (such as an A/D circuit).

In this way, an image sensing circuit can include circuits that can sample image sensing cell values. This can reduce current consumption in a read operation.

While embodiments like those shown above can include image sensor cells that include a store structure integrated with a JFET device, other embodiments can include an access device in combination with a device having a store structure. An example of such an arrangement is shown in FIG. 26.

Referring now to FIG. 26, an image sensing cell according to an alternate embodiment is shown in a schematic diagram and designated by the general reference character 2600. An image sensing cell 2600 can include a storage device 2602 and an access device 2604. A storage device 2602 can include any of the image sensing cells described above and equivalents. Thus, a storage device 2602 can provide a current path having a resistance that can vary according to exposure to light.

An access device 2604 can provide a conductive path between a storage device 2602 and a data line 2606 that is controlled according to an access line 2608. In this way, a pass device 2604 can isolate a storage device 2602 from a data line 2606. While a pass device 2604 can take a variety of forms, including an insulated gate field effect transistor, a pass device can preferably be a JFET device. One example of such an arrangement is shown in FIG. 27.

FIG. 27 shows devices of a storage cell 2700 in a side cross sectional view. A storage cell 2700 can include a storage device 2702 and an access JFET 2704. In the example shown, a storage device 2702 can have the same construction as that shown in FIGS. 2A and 2B. A pass JFET 2704 can also have a structure like that of FIGS. 2A and 2B, but does not include a store structure, and can have a shallower channel region. Pass JFET 2704 can include access gate 2707 and optionally a back gate 2705. A pass JFET 2704 can allow an image sensing cell 2700 to be placed into a low current state by operation of access gate 2707, back gate 2705, or some combination thereof.

While a storage device 2702 can have a charge gate 2710 that can enable charge and other operations to occur to store structure 2712, other embodiments may not include such a charge gate 2710. Instead, a store structure 2712 can be charged by way of a bottom charge gate 2714 (or bulk portion).

In this way, an image sensing cell can include separate devices for access and storage.

While embodiments of the present invention can include image sensing cells as described above, other embodiments can include arrays of such image sensing cells having intervening structures for altering received light. Two examples of such an arrangement are shown in FIGS. 28 to 30.

Referring now to FIG. 28, an array of image sensing cells is shown in a side cross sectional view and designated by the general reference character 2800. An array 2800 can include a number of image sensing cells 2802-0 to 2802-2. Image sensing cells (2802-0 to 2802-2) can take the form of any of those shown in the above embodiments, or equivalents. A transparent passivation layer 2804 can be formed over image sensor cells (2802-0 to 2802-2). In addition, filters 2806-0 to 2806-2 can be formed over image sensing cells (2802-0 to 2802-2) on or above passivation layer 2804.

Filters (2806-0 to 2806-2) can selectively filter out predetermined portions of a light spectrum thus allowing different image sensing cells (2802-0 to 2802-2) to store different color representations of an image.

FIG. 29 shows various possible filter arrangements for an array like that of FIG. 28. Each filter arrangement shows a top down view of a tiling of filters that can be situated over four image sensing cells. Such a tiling can be repeated over an array having a larger number of image sensing cells. Filter configuration 2902 shows a red-green-blue-green (RGBG) arrangement. Filter 2904 shows a red-green-blue-emerald (RGBE) arrangement. Filter configuration 2906 shows a cyan-yellow-green-magenta (CYGM) arrangement. Of course the particular filter arrangement shown are provided by way of example only.

In this way, an array of image sensing cells that provide channel varying resistances based on color intensity of light received by such image sensing cells.

Referring now to FIG. 30, an array of image sensing cells is shown in a side cross sectional view and designated by the general reference character 3000. An array 3000 can include a number of image sensing cells 3002-0 to 3002-2. Image sensing cells (3002-0 to 3002-2) can take the form of any of those shown in the above embodiments, or equivalents. A transparent passivation layer 3004 can be formed over image sensor cells (3002-0 to 3002-2). In addition, microlenses 3006-0 to 3006-2 can be formed over image sensing cells (3002-0 to 3002-2) on or above passivation layer 3004. Microlenses (3006-0 to 3006-2) can focus light onto image sensing cells (3002-0 to 3002-2). While FIG. 30 shows microlenses 3006-0 to 3006-2 formed directly above image sensing cells (3002-0 to 3002-2), such microlenses can be offset in a lateral direction (horizontal direction of FIG. 30) with respect to underlying image sensing cells.

In this way, an array of image sensing cells that provide channel varying resistances based on light intensity can include microlenses for focusing received light onto such image sensing cells.

Of course, filtering like that shows in FIGS. 28 and 29 can be used in combination with microlenses like those shown in FIG. 30.

While embodiments of the present invention can include structures, circuits and operations according to the various embodiments, other embodiments can include methods of fabricating image sensing cells and devices including such cells. Examples of such methods will now be described with reference to FIGS. 31A to 31I.

Referring now to FIGS. 31A to 31I, methods of forming image sensing cells are shown in a series of side cross sectional views. FIGS. 31A to 31I show the formation of an image sensing cell having a p-channel conductivity type, however, alternate arrangements can form different conductivity type devices using dopings of opposite conductivity type.

Referring now to FIG. 31A, an integrated circuit device 3100 can include a substrate having an isolation structure 3112 formed in a bulk portion 3116 that defines an active area for the formation of an image sensing cell. In one very particular arrangement, an isolation structure 3112 can be formed with shallow trench isolation (STI) techniques. Optionally, an active area can be subject to a substrate (e.g., bulk) doping adjustment step, such as an ion implantation step. A bulk portion 3116 can be a semiconductor material doped to a conductivity type opposite to that of a channel region. Thus, in the example of FIG. 31A, a bulk portion 3116 can be doped to an n-type conductivity.

Figure 31E:
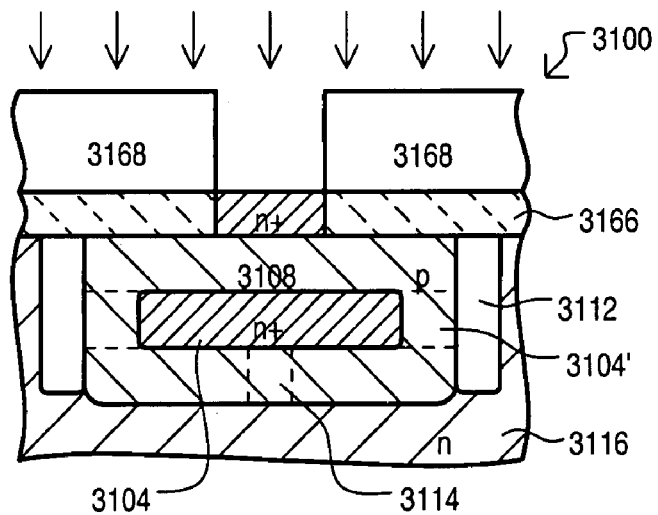

Referring now to FIG. 31B, an image sensing cell channel region 3108 can be formed. A channel region 3108 can create a channel that can have a resistance that varies according to a charge of a store structure. In addition, a channel region can help ensure that a store structure does not contact any other oppositely doped semiconductor region, such as bulk portion 3116 or a charge gate. In the particular example shown, a channel mask 3160 can be formed that exposes regions where a channel is to be formed. Impurities can be implanted to produce a channel region 3108 having a desired conductivity type and concentration. In the example of FIGS. 31A to 31I, an image sensing cell is of a p-channel type, thus, such a step can include implanting p-type impurities.

Referring now to FIG. 31C, a method can optionally include forming a discharge channel 3114. In particular, a method can include this step when forming an image sensing cell like that shown in FIG. 4 and/or 8A/B. As noted above, a discharge channel 3114 can allow a store structure to be discharged to a bulk portion 3116. In the particular example shown, a discharge path mask 3162 can be formed that exposes regions where a discharge channel is to be formed. Impurities can be implanted to produce a discharge channel 3114 having a desired conductivity type and concentration. Further, implantation energies can be selected to ensure that discharge channel 3114 can be formed within the vertical extents necessary to extend from a bulk portion 3116 to a subsequently formed store structure.

A method can also include forming a store structure within a channel region. Two possible store structure formation steps are shown in FIGS. 31D-0 and 31D-1.

Referring now to FIG. 31D-0, a method for forming a store structure like that shown in FIGS. 2A and 2B is shown in a side cross sectional view. A store structure mask 3164 can be formed that exposes regions where a store structure is to be formed. Impurities can be implanted that produce a store structure 3104 having a desired conductivity type and concentration. Implantation energies can be selected to ensure that store structure 3104 can be formed within the necessary vertical extents. That is, a store structure 3104 can be formed that will not contact a bulk portion 3116 or a charge gate.

Referring now to FIG. 31D-1, a method for forming a store structure like that shown in FIG. 3 is shown in a side cross sectional view. FIG. 31D-1 shows the same general step as that shown in FIG. 31D-0, but a store structure mask 3164' can allow a store structure to be formed that extends between opposing ends of an isolation structure 3112.

FIGS. 31D-0 and 31D-1 also show where a discharge channel 3114 can be included, if desired.

Referring now to FIG. 31E, a semiconductor electrode material 3166 can be formed over a substrate. An electrode material 3166 can be a material capable of forming a pn junction with a channel region 3108. In one particular example, an electrode material 3166 can be silicon, preferably polycrystalline silicon (polysilicon), formed over and in contact with a channel region 3108. In the particular example of FIG. 31E, an electrode material 3166 can be doped to form a charge gate electrode for an image sensing cell. Accordingly, a source/drain mask 3168 can be formed over portions of electrode material 3166 from which a source or drain electrodes are to be formed. Areas exposed by source/drain mask 3168 can be subject to an implantation step to form a charge gate electrode having the opposite conductivity type as channel region 3108 (in this particular example, n-type).

Figure 31F:
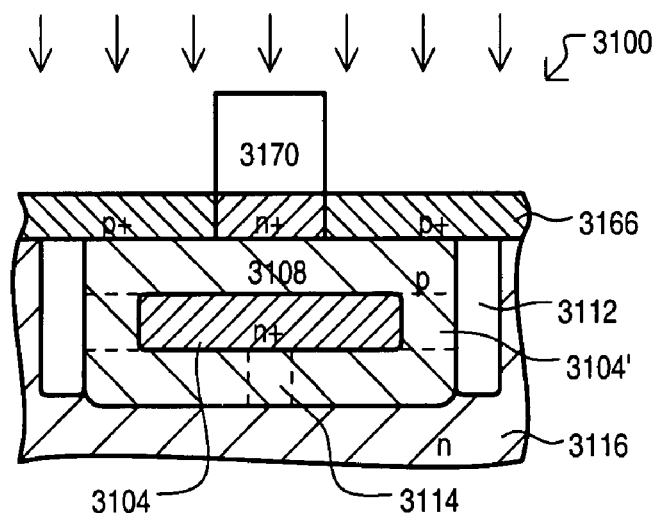

Referring to FIG. 31F, an electrode material 3166 can be doped to form read electrodes for an image sensing cell.

Accordingly, a gate mask 3170 can be formed over portions of an electrode material 3166 from which a charge gate electrode is to be formed. Areas exposed by gate mask 3170 can be subject to an implantation step that forms read electrodes having the same conductivity type as the respective channel region 3108 (in this particular example, p-type).

Figure 31G:
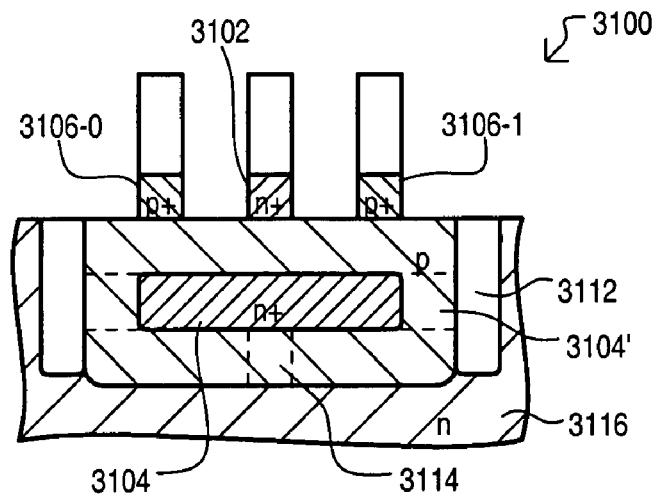

Referring now to FIG. 31G, an electrode material 3166 can be subject to an electrode patterning step. Such a step can include etching doped electrode material 3166 into electrode structures, and in one embodiment, can be a reactive ion etch. In addition, a more conductive layer could be formed over semiconductor material 3166, such a silicide layer. This more conductive layer can be formed prior to, or after electrodes are patterned. Subsequently, an image sensing cell 3100 could be subject to heat treatment step that can cause impurities to outdiffuse from electrodes into a substrate below. In the very particular example of FIG. 31G, an electrode patterning step can form a charge gate 3102, a first read electrode 3106-0 and a second read electrode 3106-1.

In this way, image sensing cells that include a store structure and JFET device can be formed in a same substrate. Further, charge gate and read electrodes for such an image sensing cell can be formed with a same semiconductor layer.

Figure 31H:
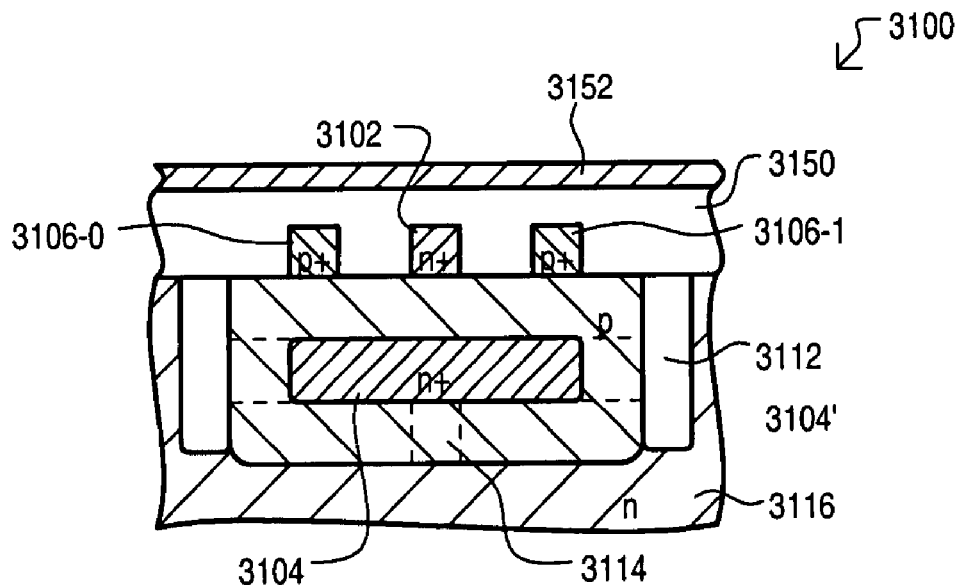

Referring now to FIG. 31H, a passivation layer 3150 can be formed over an image sensing cell. A color filter layer 3152 can then be formed on passivation layer 3150. Such a step can include multiple steps for forming different color filters at one vertical position over the image sensor cells. Alternatively, such a step can include forming different color filters at different vertical positions over the image sensor cells.

Figure 31I:
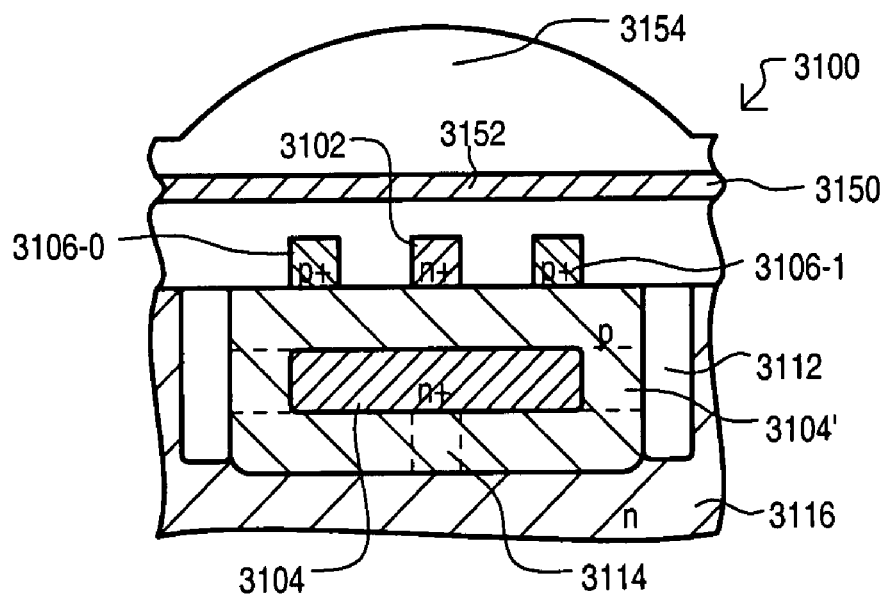

Referring now to FIG. 31I, a microlens 3154 can be formed over an image sensing cell.

In this way, image sensor cells can be formed.

Embodiments described above have included doped monocrystalline substrates that can contain a charge structure and an adjacent channel region. In such arrangements, the generation of electron-hole pairs can depend upon the energy of incident photons exceeding (and not being substantially less than) the bandgap voltage of the pn junction created by storage structure and channel region. Alternate embodiments can include different semiconductor materials or compound semiconductor materials in the event monocrystalline silicon is not sufficient for a desired image spectrum. As but one very particular example, embodiments of FIGS. 26 and 27 can include a storage device fabricated to vary from just monocrystalline silicon, while an access device can be formed from monocrystalline silicon.

Reference in the description to "one embodiment" or "an embodiment" means that a particular feature, structure, or characteristic described in connection with the embodiment is included in at least one embodiment of the invention. The appearance of the phrase "in one embodiment" in various places in the specification do not necessarily all refer to the same embodiment. The term "to couple" or "electrically connect" as used herein may include both to directly and to indirectly connect through one or more intervening components.

Further it is understood that the embodiments of the invention may be practiced in the absence of an element or step not specifically disclosed. That is, an inventive feature of the invention may include an elimination of an element.

While various particular embodiments set forth herein have been described in detail, the present invention could be subject to various changes, substitutions, and alterations without departing from the spirit and scope of the invention.

What is claimed is:

1. A method of fabricating an image sensing cell, comprising the steps of:
    forming a charge storing region comprising a semiconductor material doped to a first conductivity type;
    forming a channel region adjacent to and in contact with at least a portion of the charge storing region, the channel region comprising a semiconductor material doped to a second conductivity type;
    forming a charge gate structure comprising a semiconductor material doped to a first conductivity type and separated from the charge storing region by a semiconductor material doped to the second conductivity type; and
    forming a light altering structure over at least the charge storing region.

2. The method of claim 1, wherein:
    the light altering structure comprises at least one color filter that selectively prevents predetermined wavelengths of light from reaching the charge storing region.

3. The method of claim 1, wherein:
    the light altering structure comprises at least one microlens that focuses received light.

4. The method of claim 1, wherein:
    the charge storing region and channel region comprise doped monocrystalline silicon.

5. A method of acquiring an image with an array of image sensing cells, comprising the steps of:
    charging a store electrode in each image sensing cell by punching through a semiconductor material doped to a first conductivity type to the store electrode, the store electrode comprising a material doped to a second conductivity type;
    enabling a light transmitting path to the image sensing cells; and
    determining a light intensity value for each image sensing cell based on a resistance of a channel region for the image sensing cell, the channel region being a semiconductor material doped to the first conductivity type adjacent to the store electrode.

6. The method of claim 5, wherein:
    charging the store electrodes includes applying a voltage to at least charge electrodes formed on a surface of a semiconductor substrate over store electrodes formed below the semiconductor substrate.

7. The method of claim 5, wherein:
    charging the store electrodes includes applying a voltage of a first polarity type to charge electrodes of each image sensing cell, and applying a voltage of a second polarity type to a read electrode of each image sensing cell.

8. The method of claim 5, wherein:
    determining a light intensity value for each image sensing cell includes
        applying a potential between a first read electrode coupled to a first end of the channel region and a second read electrode coupled to a second end of the channel region, and
        generating a data value in response to a resulting current flowing through the channel region.

9. The method of claim 5, wherein:
determining a light intensity value for each image sensing cell includes
  supplying a predetermined current to the channel region, and
  measuring a resulting voltage across the channel region.

10. The method of claim 5, wherein:
determining a light intensity value for each image sensing cell includes generating a digital value corresponding to the channel region resistance for the image sensing cell.

11. The method of claim 5, wherein:
the image sensing cells are arranged into a plurality of rows; and
determining a light intensity value for each image sensing cell includes
  selecting each row of image sensing cells, and
  sensing the channel resistance for each image sensing cell of the selected row.

12. The method of claim 5, further including:
resetting each image sensing cell by enabling a discharge path from the store electrodes of the image sensing cells that allows charge to transfer from the store electrodes.

13. The method of claim 12, wherein:
enabling the discharge path includes steps selected from the group consisting of
  forward biasing a pn junction comprising the store electrode and the channel region, and
  enabling a discharge junction field effect transistor (JFET) each image sensing cell, each discharge JFET having a channel that extends from the corresponding charge electrode through the channel region and to a bulk region comprising a semiconductor material doped to the second conductivity type.

* * * * *